(12) United States Patent
Song et al.

(10) Patent No.: US 8,760,919 B2
(45) Date of Patent: Jun. 24, 2014

(54) NONVOLATILE MEMORY DEVICE AND METHOD OF READING DATA IN NONVOLATILE MEMORY DEVICE

(75) Inventors: Jung-Ho Song, Suwon-Si (KR); Jin-Yub Lee, Seoul (KR); Jae-Woo Im, Hwaseong-Si (KR); Seung-Jae Lee, Hwaseong-Si (KR); Sang-So Park, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 13/598,892

(22) Filed: Aug. 30, 2012

(65) Prior Publication Data

US 2013/0128662 A1    May 23, 2013

(30) Foreign Application Priority Data

Nov. 18, 2011    (KR) .......................... 10-2011-0120557

(51) Int. Cl.
*G11C 11/56*    (2006.01)
*G11C 16/04*    (2006.01)

(52) U.S. Cl.
CPC ............... *G11C 11/56* (2013.01); *G11C 16/04* (2013.01); *G11C 2211/56* (2013.01)
USPC .................................. 365/185.03; 365/185.17

(58) Field of Classification Search
CPC ........... G11C 11/5628; G11C 11/5642; G11C 11/5621; G11C 16/0483; G11C 2211/5621
USPC ........................................ 365/185.03, 185.17
See application file for complete search history.

(56) References Cited

U.S. PATENT DOCUMENTS

| | | |
|---|---|---|
| 7,872,910 B2 | 1/2011 | Honma et al. |
| 7,936,610 B1 | 5/2011 | Melcher et al. |
| 2008/0259686 A1 | 10/2008 | Hwang |
| 2009/0313423 A1 | 12/2009 | Byeon |
| 2010/0149869 A1* | 6/2010 | Kim et al. ................ 365/185.03 |

FOREIGN PATENT DOCUMENTS

| | | |
|---|---|---|
| KR | 10-0875979 | 12/2008 |
| KR | 1020090131105 A | 12/2009 |

* cited by examiner

*Primary Examiner* — Jason Lappas
(74) *Attorney, Agent, or Firm* — Volentine & Whitt, PLLC

(57) ABSTRACT

A method is provided for reading data in a nonvolatile memory device. The method includes performing a first read operation on multiple multi-level memory cells (MLCs), performing a first sensing operation on at least one flag cell corresponding to the MLCs, selectively performing a second read operation on the MLCs based on a result of the first sensing operation, and performing a second sensing operation on the at least one flag cell when the second read operation is performed. Read data is output based on results of the first read operation and the first sensing operation when the second read operation is not performed, and the read data is output based on result of the first read operation, the first sensing operation, the second read operation and the second sensing operation when the second read operation is performed. The read data corresponds to programmed data in the MLCs.

20 Claims, 14 Drawing Sheets

NONVOLATILE MEMORY DEVICE AND METHOD OF READING DATA IN NONVOLATILE MEMORY DEVICE

CROSS-REFERENCE TO RELATED APPLICATION

A claim of priority under 35 U.S.C. §119 is made to Korean Patent Application No. 2011-0120557, filed on Nov. 18, 2011, in the Korean Intellectual Property Office, the entire contents of which are hereby incorporated by reference.

BACKGROUND

Examplary embodiments relate to semiconductor memory devices, and more particularly to methods of reading data in nonvolatile memory devices and methods of operating the nonvolatile memory devices.

Semiconductor memory devices can be generally divided into two categories, according to whether they retain stored data when disconnected from power. These categories include volatile memory devices, which lose stored data when disconnected from power, and nonvolatile memory devices, which retain stored data when disconnected from power. Memory cells of a nonvolatile memory device, such as a flash memory device, may be classified into single-level memory cells (SLCs) that store one bit of data per memory cell and multi-level memory cells (MLCs) that store more than one bit of data per memory cell. MLCs may have different patterns of threshold voltage distributions depending on the number of bits of data programmed in the MLCs. Typically, a nonvolatile memory device including MLCs may include at least one flag cell that represents the number of bits of data programmed in corresponding MLCs.

SUMMARY

Accordingly, various embodiments are provided to substantially obviate one or more problems due to limitations and disadvantages of the related art. Some embodiments provide a method of reading data in a nonvolatile memory device capable of effectively reading data stored in MLCs. Other embodiments provide a method of operating the nonvolatile memory device capable of reducing a read error.

According to exemplary embodiments, a method is provided for reading data in a nonvolatile memory device. The method includes performing a first read operation on a multiple multi-level memory cells (MLCs), performing a first sensing operation on at least one flag cell corresponding to the MLCs, selectively performing a second read operation on the MLCs based on a result of the first sensing operation, and performing a second sensing operation on the at least one flag cell when the second read operation is performed. Read data is output based on a result of the first read operation and the result of the first sensing operation when the second read operation is not performed, and the read data is output based on the result of the first read operation, the result of the first sensing operation, a result of the second read operation and a result of the second sensing operation when the second read operation is performed. The read data corresponds to programmed data in the MLCs.

The first sensing operation may determine a number of bits of data programmed in each MLC. The second sensing operation may determine whether electric charges stored in the at least one flag cell are lost.

The second read operation and the second sensing operation may be performed when it is determined based on the result of the first sensing operation that one bit of data is programmed in each MLC. The second read operation and the second sensing operation may be skipped when it is determined based on the result of the first sensing operation that at least two bits of data are programmed in each MLC.

Performing the first read operation may include generating first data by reading first bits of the programmed data in the MLCs based on a first read voltage, and storing the first data in a first storage unit. Performing the first sensing operation may include comparing a threshold voltage of the at least one flag cell with the first read voltage.

Selectively performing the second read operation may include generating second data by re-reading the first bits of the programmed data in the MLCs based on a second read voltage when a level of the threshold voltage of the at least one flag cell is lower than a level of the first read voltage, and storing the second data in the first storage unit. Performing the second sensing operation may include comparing the threshold voltage of the at least one flag cell with the second read voltage.

The method for reading data in a nonvolatile memory device may further include selectively performing a third read operation on the MLCs based on a result of the second sensing operation. Selectively performing the third read operation may include generating third data by re-reading the first bits of the programmed data in the MLCs based on the first read voltage when the level of the threshold voltage of the at least one flag cell is higher than a level of the second read voltage, and storing the third data in the first storage unit. Outputting the read data may include outputting the first data stored in the first storage unit as the read data when the level of the threshold voltage of the at least one flag cell is higher than the level of the first read voltage, outputting the second data stored in the first storage unit as the read data when the level of the threshold voltage of the at least one flag cell is lower than the level of the second read voltage, and outputting the third data stored in the first storage unit as the read data when the level of the threshold voltage of the at least one flag cell is lower than the level of the first read voltage and higher than the level of the second read voltage.

The selectively performing the second read operation may include generating second data by re-reading the first bits of the programmed data in the MLCs based on a second read voltage when a level of the threshold voltage of the at least one flag cell is lower than a level of the first read voltage, and storing the second data in a second storage unit. Performing the second sensing operation may including comparing the threshold voltage of the at least one flag cell with the second read voltage. Outputting the read data may include outputting the first data stored in the first storage unit as the read data when the level of the threshold voltage of the at least one flag cell is higher than the level of the first read voltage, or when the level of the threshold voltage of the at least one flag cell is lower than the level of the first read voltage and is higher than a level of the second read voltage, and outputting the second data stored in the second storage unit as the read data when the level of the threshold voltage of the at least one flag cell is lower than the level of the second read voltage.

The first bits may be least significant bits (LSBs) of the programmed data in the MLCs, and the read data may correspond to the LSBs of the programmed data.

The MLCs may include two-bit MLCs each of which stores two bits of data, or three-bit MLCs each of which stores three bits of data. The MLCs may include NAND flash memory cells.

According to other exemplary embodiments, a method is provided for operating a nonvolatile memory device. The method includes programming multiple multi-level memory cells (MLCs) based on a program command received from an external control circuit, and reading programmed data in the MLCs based on a read command received from the external control circuit. Reading the programmed data in the MLCs includes performing a first read operation on the MLCs, performing a first sensing operation on at least one flag cell corresponding to the MLCs, selectively performing a second read operation on the MLCs based on a result of the first sensing operation, and performing a second sensing operation on the at least one flag cell when the second read operation is performed. Read data is output based on a result of the first read operation and the result of the first sensing operation when the second read operation is not performed, and the read data is output based on the result of the first read operation, the result of the first sensing operation, a result of the second read operation and a result of the second sensing operation when the second read operation is performed. The read data corresponds to programmed data in the MLCs.

According to other exemplary embodiments, a nonvolatile memory device includes a memory cell array, an input/output (I/O) circuit, and a control circuit. The memory cell array includes multi-level memory cells (MLCs) and at least one flag cell corresponding to the MLCs, the at least one flag cell storing information about a number of bits of data programmed in each of the MLCs. The I/O circuit is configured to read programmed data stored in the MLCs, the I/O circuit including at least one page buffer having at least one storage unit. The control circuit is configured to generate first data by controlling the I/O circuit to read first bits of the programmed data stored in the MLCs based on a first read voltage, to compare a threshold voltage of the at least one flag cell with the first read voltage, to output the first data as read data when the threshold voltage of the at least one flag cell is higher than the first read voltage, to generate second data by controlling the I/O circuit to re-read the first bits of the programmed data in the MLCs based on a second read voltage when the threshold voltage of the at least one flag cell is lower than the first read voltage, and to compare the threshold voltage of the at least one flag cell with the second read voltage to determine the read data to output.

Accordingly, to read data in the nonvolatile memory device, the first sensing operation may be performed on the at least one flag cell based on the first read voltage to determine the number of bits of the data programmed in each MLC, and the second sensing operation may be selectively performed on the at least one flag cell based on the second read voltage to determine whether the electric charges stored in the at least one flag cell are lost. Thus, the nonvolatile memory device effectively reads the programmed data stored in the MLCs, and has improved performance over conventional devices with reduced data read error.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
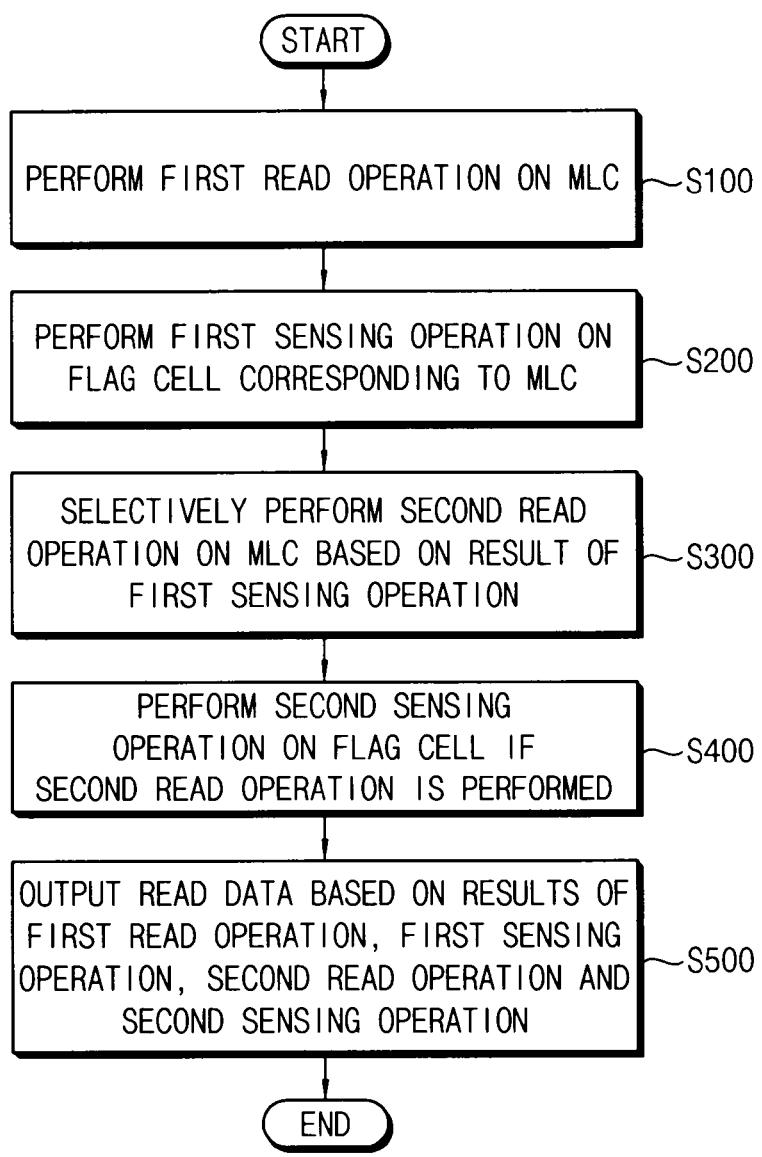
FIG. 1 is a flowchart illustrating a method of reading data in a nonvolatile memory device, according to exemplary embodiments.

Various embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

It will be understood that, although the terms "first," "second," etc., may be used herein to describe various elements, these elements should not be limited by these terms. Rather, these terms are used to distinguish one element from another. For example, a "first element" could be termed a "second element," and, similarly, a "second element" could be termed a "first element," without departing from the scope of the teachings. As used herein, the term "and/or" includes any and all combinations of one or more of the associated listed items. Also, the term "exemplary" is intended to refer to an example or illustration.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart illustrating a method of reading data in a nonvolatile memory device, according to exemplary embodiments.

The method illustrated in FIG. 1 may be applied in a nonvolatile memory device including multiple multi-level memory cells (MLCs), such that multi-bit data (e.g., at least two bits of data) are stored (e.g., programmed) in each MLC. Hereinafter, the method of reading data in the nonvolatile memory device will be described based on a NAND flash memory device including the MLCs. However, the method of reading data alternatively may be applied in various nonvolatile memory devices including the MLCs, such as a NOR flash memory device, phase change random access memory (PRAM), resistance random access memory (RRAM), magnetic random access memory (MRAM), ferroelectric random access memory (FRAM), etc. Detailed configurations of the NAND flash memory device and a memory cell array included in the NAND flash memory device are described below with reference to FIGS. 2, 3A and 3B.

Referring to FIG. 1, in the method of reading data according to exemplary embodiments, a first read operation is performed on the MLCs (step S100). For example, the first read operation may be performed based on a first read voltage. In the NAND flash memory device, the first read operation may be performed per page.

A first sensing operation is performed on at least one flag cell corresponding to the MLCs (step S200). For example, the first sensing operation may be performed based on the first read voltage. The at least one flag cell may store information about the number of bits of data programmed in each of the MLCs. In the NAND flash memory device, the at least one flag cell may be assigned per page.

The number of bits of the data programmed in each MLC may vary depending on program conditions and/or types of data. In an embodiment, when the MLCs are two-bit MLCs, one bit of data or two bits of data may be programmed in each MLC. In another embodiment, when the MLCs are three-bit MLCs, one bit of data, two bits of data or three bits of data may be programmed in each MLC. As will be described below with reference to FIGS. 4A, 4B, 4C, 7A, 7B, 7C and 7D, the MLCs may have different patterns of threshold voltage distributions depending on the number of bits of the data programmed in each MLC. Thus, in the method of reading data according to exemplary embodiments, the first sensing operation may be performed to determine the number of bits of data programmed in each MLC, and then the programmed data in the MLCs may be read based on the first sensing operation.

A second read operation is selectively performed on the MLCs based on results of the first sensing operation (step S300). For example, when it is determined based on the result of the first sensing operation that one bit of data is programmed in each MLC, the second read operation may be performed. When it is determined based on the result of the first sensing operation that at least two bits of data are programmed in each MLC, the second read operation may be skipped. The second read operation may be performed based on a second read voltage, and a level of the second read voltage may be lower than a level of the first read voltage.

When the second read operation is performed, a second sensing operation is performed on the at least one flag cell (step S400). In other words, when it is determined based on the result of the first sensing operation that one bit of data is programmed in each MLC, the second sensing operation may be performed. When it is determined based on the result of the first sensing operation that at least two bits of data are programmed in each MLC, the second sensing operation may be skipped. The second sensing operation may be performed based on the second read voltage.

Similarly to normal memory cells, a flag cell may store information (e.g., information about the number of bits of the data programmed in each MLC) by storing electric charges. A charge loss in the flag cell may cause a data read error. For example, even though at least two bits of data are programmed in each MLC, it may be determined that one bit of data is programmed in each MLC due to the charge loss in the flag cell, and such misjudgment may cause the data read error. Thus, in the method of reading data according to exemplary embodiments, the second sensing operation may be performed to determine whether electric charges stored in the at least one flag cell are lost, thereby reducing the data read error.

Read data are output based on the result of the first read operation, the result of the first sensing operation, the result of the second read operation and the result of the second sensing operation (step S500). The read data corresponds to the programmed data in the MLCs. For example, when it is determined that one bit of data is programmed in each MLC, the read data may be output based on the result of the second read operation. When it is determined that at least two bits of data are programmed in each MLC, the read data may be output based on the result of the first read operation. The read data may correspond to a combination of bits of the programmed data in the MLCs. For example, when at least two bits of data are programmed in each MLC, the read data may correspond to a combination of least significant bits (LSBs) of the programmed data in the MLCs. When one bit of data is programmed in each MLC, the read data may be substantially the same as the programmed data in the plurality of MLCs.

In a conventional method of reading data in a nonvolatile memory device, one sensing operation is performed on a flag cell to determine the number of bits of data programmed in each MLC, and a charge loss in the flag cell may cause a data read error.

In the method of reading data in the nonvolatile memory device according to exemplary embodiments, at least two sensing operations are performed on the at least one flag cell. For example, the first sensing operation may be performed on the at least one flag cell based on the first read voltage to determine the number of bits of data programmed in each MLC, and the second sensing operation may be selectively performed on the at least one flag cell based on the second read voltage to determine whether the electric charges stored in the at least one flag cell are lost. Accordingly, the nonvolatile memory device effectively read the programmed data stored in the MLCs, and have a relatively improved performance with a relatively reduced data read error.

Although not illustrated in FIG. 1, more than two sensing operations may be performed on the at least one flag cell in the method of reading data, according to exemplary embodiments, without departing from the scope of the present teachings.

Hereinafter, the method of reading data according to exemplary embodiments will be explained in detail with reference to various exemplary configurations of the NAND flash memory device and the memory cell array.

Figure 2:
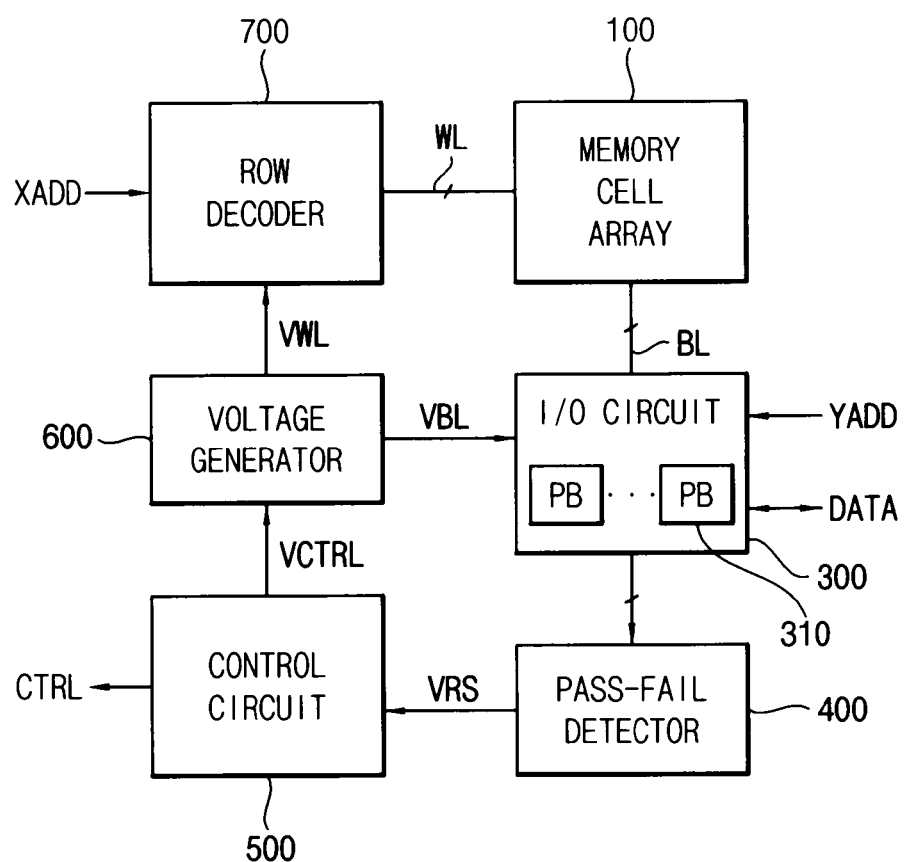
FIG. 2 is a block diagram illustrating a nonvolatile memory device for describing the method of FIG. 1, according to exemplary embodiments.

FIG. 2 is a block diagram illustrating a nonvolatile memory device for describing the method of FIG. 1, according to exemplary embodiments.

Referring to FIG. 2, a nonvolatile memory device 10 includes a memory cell array 100, a row decoder 700, an input/output (I/O) circuit 300, a pass-fail detector 400, a control circuit 500, and a voltage generator 600. The nonvolatile memory device 10 may be a flash memory device, for example.

The memory cell array 100 includes multiple memory cells. Each memory cell is connected to a respective one of multiple wordlines WL and a respective one of multiple bitlines BL. As will be described below with reference to FIGS. 3A and 3B, the memory cells may include NAND flash memory cells, and may be arranged in a two-dimensional (2-D) array structure or a three-dimensional (3-D) vertical array structure (e.g., a vertical memory device having a stacked structure). The memory cells may include MLCs in which more than one bit of data is stored in each of memory cells. In the MLCs, the memory cells may be programmed using various program schemes, such as a shadow programming scheme, a reprogramming scheme or an on-chip buffered programming scheme. Some memory cells may be used as flag cells for storing information about the number of bits of data programmed in each MLC.

The row decoder 700 selects one of the wordlines WL based on a row address XADD, and consequently memory cells connected to the selected wordline are selected. In a program mode, a program voltage and a verification voltage are sequentially applied to the selected wordline. In a read mode, read voltages are applied to the selected wordline. In an erase mode, an erase voltage is applied to the selected wordline. Such wordline voltage VWL (e.g., the program voltage, the verification voltage, the read voltages, the erase voltage, etc.) applied to the wordlines WL may be generated by the voltage generator 600 in response to a voltage control signal VCTRL provided from the control circuit 500.

The I/O circuit 300 is connected to the bitlines BL, and stores data to be written in the memory cell array 100 or data read out from the memory cell array 100. The I/O circuit 300 may include multiple page buffers 310, each of which is disposed corresponding to a respective one of the bitlines BL and includes multiple data latches. The I/O circuit 300 may operate as a sense amplifier or a write driver depending on the operation modes. For example, the I/O circuit 300 may operate as a sense amplifier during the read mode, and may operate as a write driver during the program mode. The I/O circuit 300 may further provide a function of a column decoder that selects the bitlines BL based on a column address YADD. Each of the page buffers 310 includes at least one storage unit.

The I/O circuit 300 performs a program operation, the read operations according to the various embodiments, and an erase operation in response to a control signal CTRL provided from the control circuit 500. In the program mode, the I/O circuit 300 loads data provided from an external device and applies the program permission voltage or the program inhibition voltage to each of bitlines BL based on the write data. As such, target memory cells which are currently to be programmed correspond to the memory cells that are coupled to the selected wordline and the bitlines to which the program permission voltage is applied. The verification operation is performed after programming the target memory cells to determine whether the target memory cells are successfully programmed. Such program and verification operations may be repeated until a target state is completely programmed. In the read mode, the I/O circuit 300 outputs read data by detecting voltages of the bitlines BL. Operations of the I/O circuit 300 in the erase mode may be similar to the operations of the I/O circuit 300 in the program mode.

The pass-fail detector 400 generates a detection signal VRS which indicates whether at least one of the target memory cells corresponds to a failed program state or all of the target memory cells correspond to normal program states.

The control circuit 500 generates the control signal CTRL for controlling overall operation of the nonvolatile memory device 10, including performance of the method steps according to the various embodiments, and the voltage control signal VCTRL for controlling the voltage generator 600. For example, the voltage control signal VCTRL may include information about controlling the first and second read voltages that are used in the first read operation, the first sensing operation, the second read operation and the second sensing operation. According to exemplary embodiments, the control circuit 500 may be located inside or outside the nonvolatile memory device 10.

The voltage generator 600 generates the wordline voltage VWL and a bitline voltage VBL in response to the voltage control signal VCTRL. The wordline voltage VWL applied to the row decoder 700 may include the program voltage, the verification voltage, the read voltages, the erase voltage, etc. The bitline voltage VBL applied to the I/O circuit 300 may include the program permission voltage, the program inhibition voltage, a precharge voltage, etc.

Figure 3A:
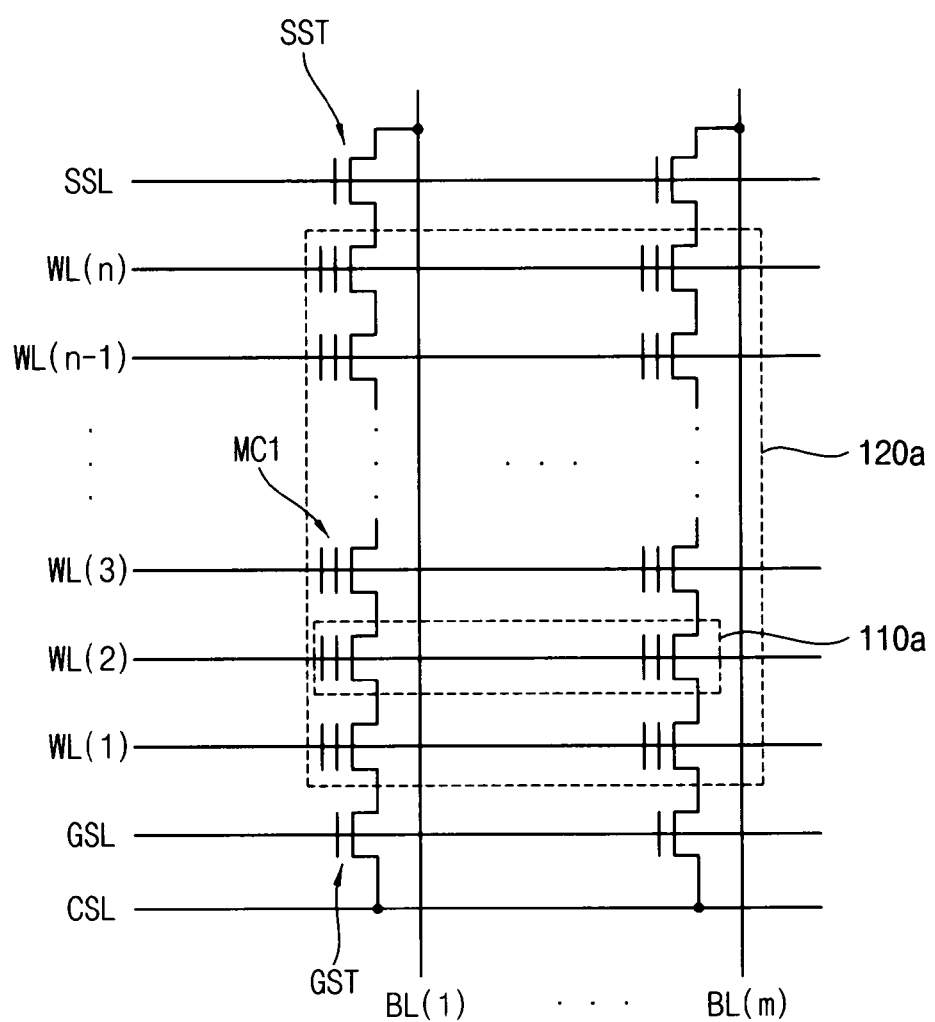
FIGS. 3A and 3B are circuit diagrams illustrating examples of a memory cell array included in the nonvolatile memory device of FIG. 2, according to exemplary embodiments.
Figure 3B:
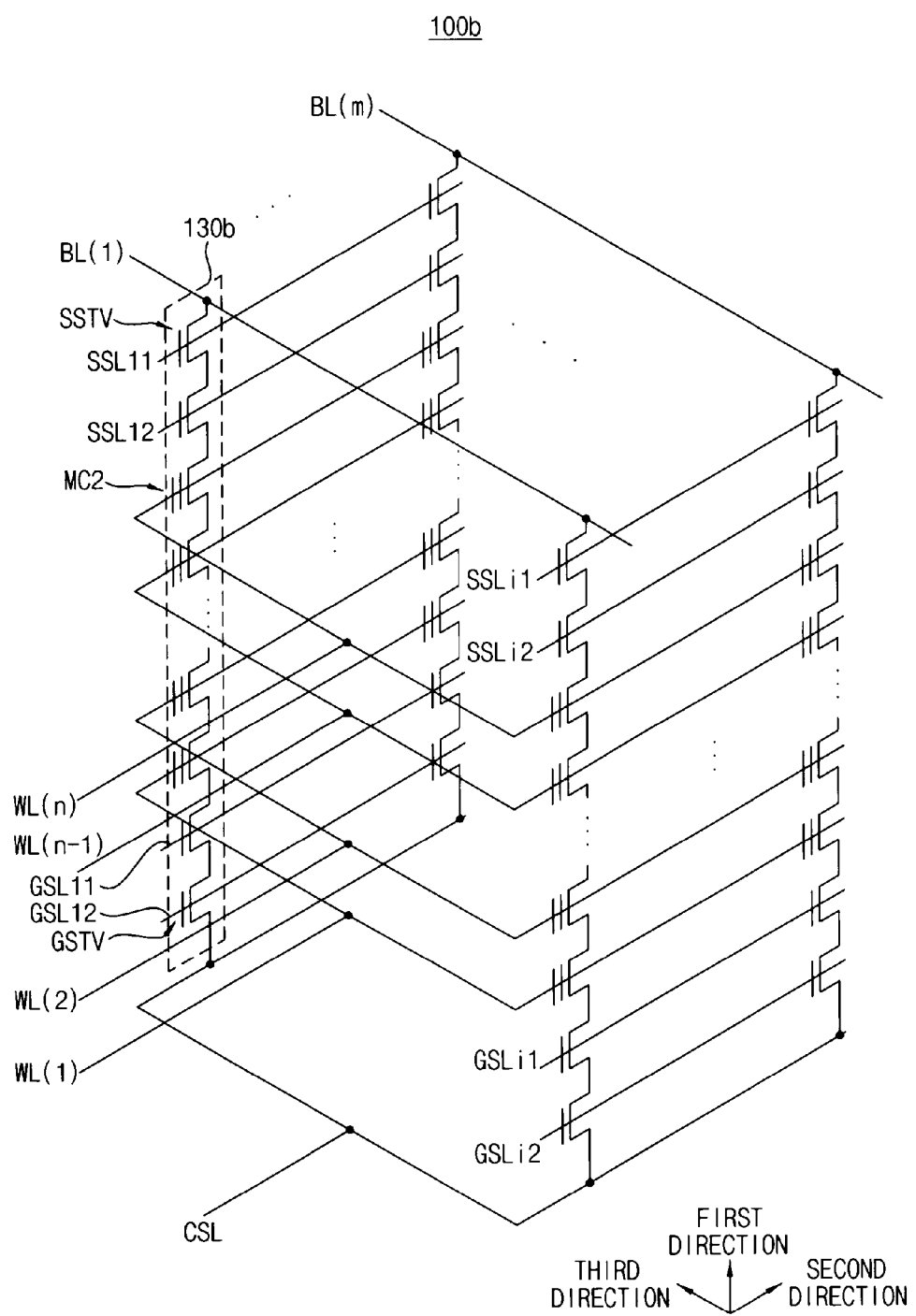

FIGS. 3A and 3B are circuit diagrams illustrating examples of a memory cell array included in the nonvolatile memory device of FIG. 2, according to exemplary embodiments.

Referring to FIG. 3A, memory cell array 100a includes multiple strings, each string including a string select transistor SST, a ground select transistor GST and multiple memory cells MC1. The string select transistors SST are connected to bitlines BL(1), . . . , BL(m), respectively, and the ground select transistors GST are connected to a common source line CSL. The memory cells MC1 may be connected in series between the string select transistors SST and the ground select transistors GST. Memory cells in the same row are connected to the same wordline among wordlines WL(1), WL(2), WL(3), . . . , WL(n−1), WL(n). For example, 16, 32 or 64 wordlines may be disposed between a string select line SSL and a ground select line GSL.

The string select transistors SST are connected to the string select line SSL, and controlled by a voltage applied to the string select line SSL. The ground select transistors GST are connected to the ground select line GSL, and controlled by a voltage applied to the ground select line GSL. The memory cells MC1 are controlled by voltages applied to the wordlines WL(1), . . . , WL(n), respectively.

In the NAND flash memory device including the memory cell array 100a, a read operation and a program operation may be performed per page 110a, and an erase operation may be performed per block 120a. According to exemplary embodiments, each page buffer 310 of FIG. 2 may be connected to an odd-numbered bitline and an even-numbered bitline. In this case, the odd-numbered bitlines form odd-numbered pages, the even-numbered bitlines form even-numbered pages, and program operations for the odd-numbered pages and the even-numbered pages may be alternately performed.

Referring to FIG. 3B, memory cell array 100b includes multiple strings 130b, each of which has a vertical structure. The strings 130b are formed in a second direction to define a string column, and multiple string columns are formed in a third direction to define a string array. Each string includes a string select transistors SSTV, a ground select transistor GSTV, and multiple memory cells MC2 that are formed in a first direction and are connected in series between the string select transistor SSTV and the ground select transistor GSTV.

The string select transistors SSTV are connected to bitlines BL(1), ..., BL(m), respectively, and the ground select transistors GSTV are connected to a common source line CSL. The string select transistors SSTV are connected to string select lines SSL11, SSL12, ..., SSLi1, SSLi2, and the ground select transistors GSTV are connected to ground select lines GSL11, GSL12, ..., GSLi1, GSLi2, respectively. The memory cells in the same layer may be connected to the same wordline among wordlines WL(1), WL(2), ... WL(n-1), WL(n). Each string select line SSL11, ..., SSLi2 and each ground select line GSL11, ..., GSLi2 extends in the second direction, and the string select lines SSL11, ..., SSLi2 and the ground select lines GSL11, ..., GSLi2 are formed in the third direction. Each wordline WL(1), ..., WL(n) extends in the second direction, and the wordlines WL(1), ..., WL(n) are formed in the first direction and the third direction. Each bitline BL(1), ..., BL(m) extends in the third direction, and the bitlines BL(1), ..., BL(m) are formed in the second direction. The memory cells MC2 are controlled by voltages applied to the wordlines WL(1), ..., WL(n).

Similarly to the NAND flash memory device, in the vertical flash memory device including the memory cell array 100b, a read operation and a program operation may be performed per page, and an erase operation may be performed per block.

Although not illustrated in FIG. 3B, according to exemplary embodiments, two string select transistors included in a single string may be connected to a single string select line, and two ground select transistors included in the single string may be connected to a single ground select line. According to exemplary embodiments, the single string may include one string select transistor and one ground select transistor.

Figure 4A:
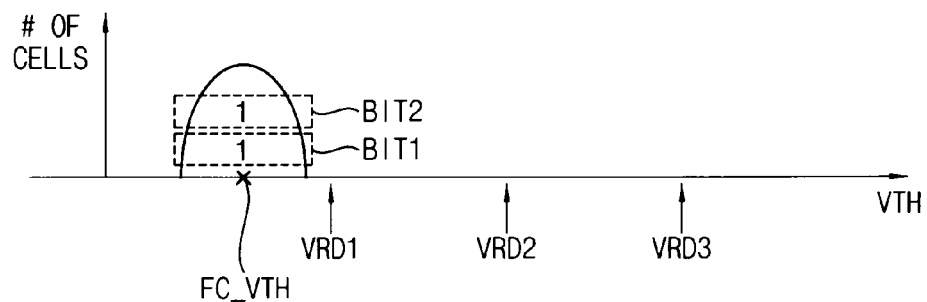
FIGS. 4A, 4B and 4C are diagrams for describing the method of FIG. 1, according to exemplary embodiments.
Figure 4B:
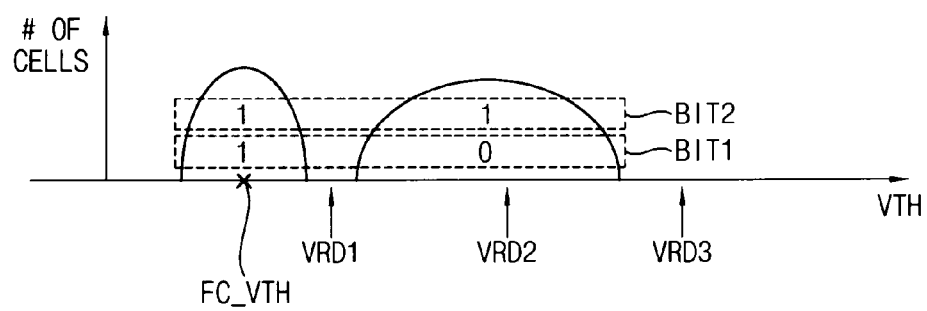
Figure 4C:
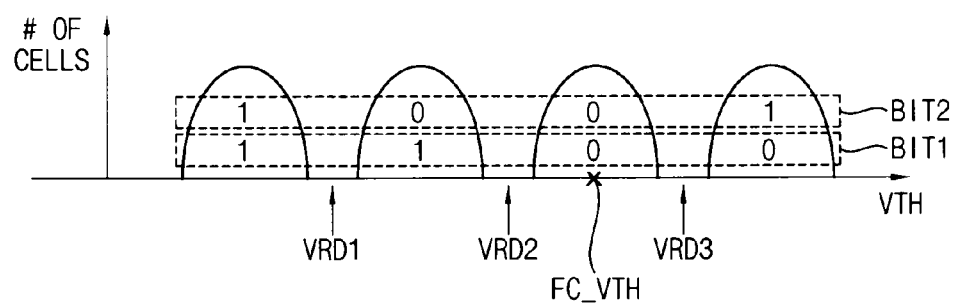

FIGS. 4A, 4B and 4C are diagrams for describing the method of FIG. 1, according to exemplary embodiments.

FIGS. 4A, 4B and 4C illustrate examples of threshold voltage distributions and logic states of MLCs and read voltages used in the method of reading data, according to exemplary embodiments. In FIGS. 4A, 4B and 4C, the MLCs are two-bit MLCs and perform the read and sensing operations based on three read voltages VRD1, VRD2 and VRD3. "FC_VTH" indicates a threshold voltage of a flag cell corresponding to the MLCs, "BIT1" indicates a first bit (e.g., a LSB or a lower bit) of multi-bit data in each MLC, and "BIT2" indicates a second bit (e.g., a most significant bit (MSB) or an upper bit) of the multi-bit data in each MLC.

Referring to FIG. 4A, when data is not programmed in each MLC (e.g., two-bit MLC), the MLCs may have a first pattern of threshold voltage distributions such that levels of threshold voltages of all MLCs are lower than a level of a first read voltage VRD1. As illustrated in FIG. 4A, the logic states of the MLCs may be in one logic state, such as "11." A level of the threshold voltage FC_VTH of the flag cell is lower than the level of the first read voltage VRD1.

Referring to FIG. 4B, when one bit of data is programmed in each MLC, the MLCs may have a second pattern of threshold voltage distributions such that threshold voltage distributions of the MLCs are separated with respect to the first read voltage VRD1. As illustrated in FIG. 4B, the logic states of the MLCs may be in two different logic states, such as "11" and "10" in the increasing order of the threshold voltage. In this case, the first bit BIT1 of the multi-bit data in each MLC is determined using the first read voltage VRD1. The level of the threshold voltage FC_VTH of the flag cell is still lower than the level of the first read voltage VRD1.

Referring to FIG. 4C, when two bits of data are programmed in each MLC, the MLCs may have a third pattern of threshold voltage distributions such that threshold voltage distributions of the MLCs are separated with respect to the read voltages VRD1, VRD2 and VRD3. As illustrated in FIG. 4C, the logic states of the MLCs may be in four different logic states, such as "11", "01", "00" and "10" in the increasing order of the threshold voltage. In this case, the first bit BIT1 of the multi-bit data in each MLC is determined using a second read voltage VRD2, and the second bit BIT2 of the multi-bit data in each MLC is determined using the first read voltage VRD1 and a third read voltage VRD3. The level of the threshold voltage FC_VTH of the flag cell is higher than a level of the second read voltage VRD2 and lower than a level of the third read voltage VRD3.

Figure 5:
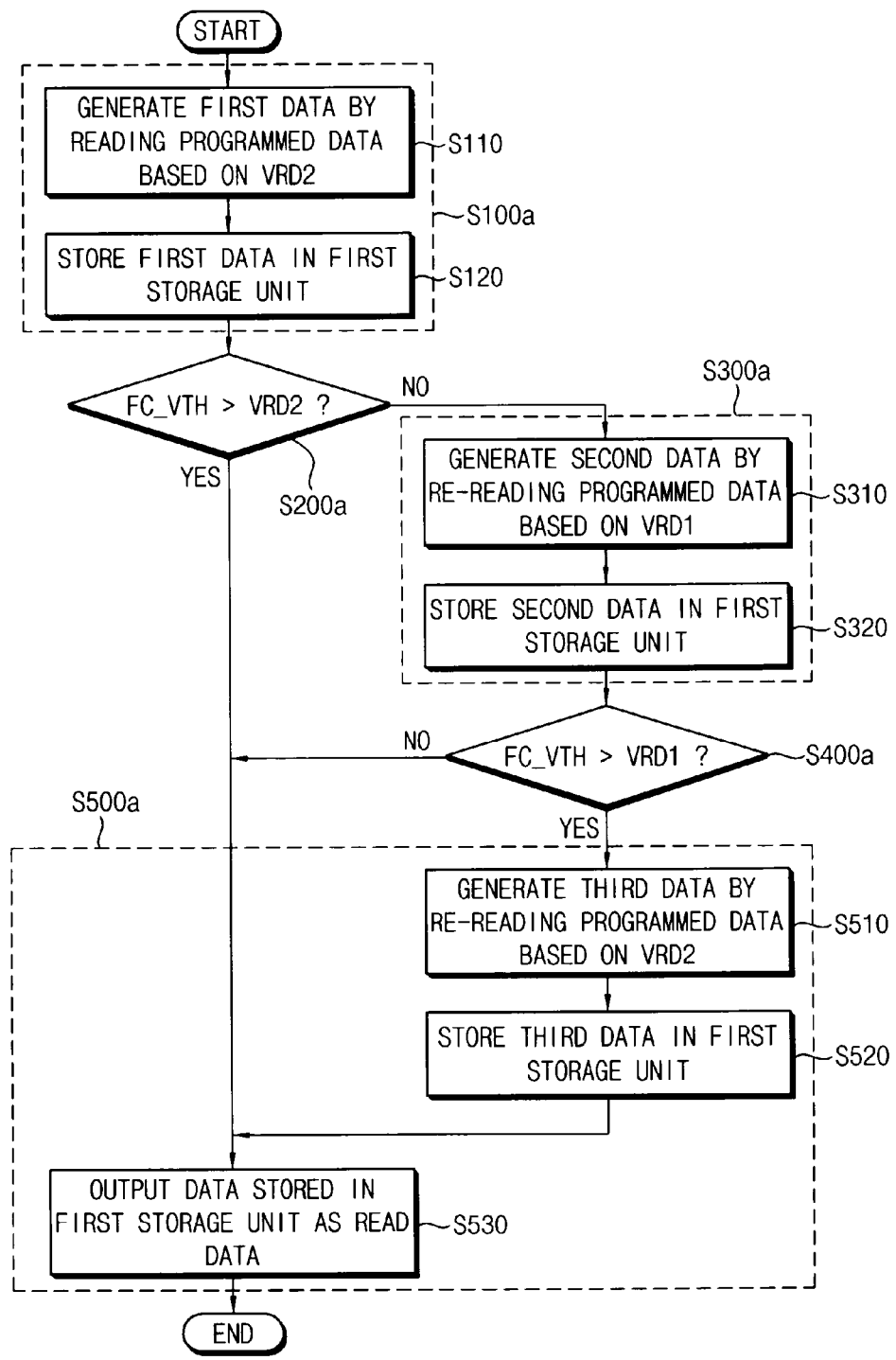
FIG. 5 is a flowchart illustrating an example of the method of reading data of FIG. 1, according to exemplary embodiments.

FIG. 5 is a flowchart illustrating an example of the method of reading data of FIG. 1, according to exemplary embodiments. Hereinafter, an example of the method of reading first bits (e.g., LSBs) of multi-bit data in two-bit MLCs will be explained in detail with reference to FIGS. 4A, 4B, 4C and 5.

In the first read operation on the MLCs (step S100a), first data are generated by reading the first bits BIT1 of the programmed data in the two-bit MLCs based on the second read voltage VRD2 (step S110), and the first data are stored in a first storage unit (step S120). For example, a first determination may be performed based on the second read voltage VRD2. When levels of threshold voltages of some two-bit MLCs are higher than the level of the second read voltage VRD2, the first bits BIT1 of data in some two-bit MLCs may be determined as "0". When levels of threshold voltages of other two-bit MLCs are lower than the level of the second read voltage VRD2, the first bits BIT1 of data in other two-bit MLCs may be determined as "1". The first data may be generated based on the first determination. The first storage unit may be included in the page buffer 310 in FIG. 2.

In the first sensing operation on the at least one flag cell, the threshold voltage FC_VTH of the flag cell is compared with the second read voltage VRD2 (step S200a). The two-bit MLCs and the flag cell may be included in the same page (e.g., a reading page which is currently to be read) of the NAND flash memory device. The first read operation and the first sensing operation may be performed substantially at the same time.

When the level of the threshold voltage FC_VTH of the flag cell is lower than the level of the second read voltage VRD2, it may be determined that one bit of data is programmed in each two-bit MLC, as illustrated in FIG. 4B. In this case, since the first bits BIT1 of the programmed data in the two-bit MLCs have to be determined using the first read voltage VRD1, the second read operation is further performed. In the second read operation on the MLCs (step S300a), second data are generated by re-reading the first bits BIT1 of the programmed data in the two-bit MLCs based on the first read voltage VRD1 (step S310), and the second data are stored in the first storage unit (step S320). For example, a second determination may be performed based on the first read voltage VRD1. When levels of threshold voltages of some two-bit MLCs are higher than the level of the first read voltage VRD1, the first bits BIT1 of data in some two-bit MLCs may be determined as "0". When levels of threshold voltages of other two-bit MLCs are lower than the level of the first read voltage VRD1, the first bits BIT1 of data in other two-bit MLCs may be determined as "1". The second data may be generated based on the second determination. Since the second data are stored in the first storage unit, the first data may be deleted from the first storage unit.

When the second read operation is performed, the second sensing operation is performed. In the second sensing operation on the at least one flag cell, the threshold voltage FC_VTH of the flag cell is compared with the first read voltage VRD1 (step S400a). The second read operation and the second sensing operation may be performed substantially at the same time.

The read data that corresponds to the programmed data in the MLCs may be output based on the result of the first read operation, the result of the first sensing operation, the result of the second read operation and the result of the second sensing operation (step S500a). For example, when the level of the threshold voltage FC_VTH of the flag cell is higher than the level of the second read voltage VRD2 (step S200a: YES), it is determined that two bits of data are programmed in each two-bit MLC, as illustrated in FIG. 4C. In this case, since the first bits BIT1 of the programmed data in the two-bit MLCs have to be determined using the second read voltage VRD2, the second read operation (step S300a) and the second sensing operation (step S400a) may be skipped, and the first data that are generated by the first read operation and are stored in the first storage unit may be output as the read data (step S530).

Further, when the level of the threshold voltage FC_VTH of the flag cell is lower than the level of the first read voltage VRD1 (step S200a: NO and step S400a: NO), it is determined that one bit of data is programmed in each two-bit MLC, as illustrated in FIG. 4B. In this case, since the first bits BIT1 of the programmed data in the two-bit MLCs have to be determined using the first read voltage VRD1, the second read operation (step S300a) and the second sensing operation (step S400a) are performed, and the second data that are generated by the second read operation and stored in the first storage unit may be output as the read data (step S530).

Further, when the level of the threshold voltage FC_VTH of the flag cell is lower than the level of the second read voltage VRD2 and higher than the level of the first read voltage VRD1 (step S200a: NO and step S400a: YES), it is determined that two bits of data are programmed in each two-bit MLC and electric charges stored in the flag cell are lost. When one bit of data is programmed in each two-bit MLC, the level of the threshold voltage FC_VTH of the flag cell has to be lower than the level of the first read voltage VRD1, as illustrated in FIG. 4B. However, when the level of the threshold voltage FC_VTH of the flag cell is lower than the level of the second read voltage VRD2 and is higher than the level of the first read voltage VRD1, it is determined that the level of the threshold voltage FC_VTH of the flag cell is higher than the level of the second read voltage VRD2 in an initial operation time, and then the level of the threshold voltage FC_VTH of the flag cell becomes lower than the level of the second read voltage VRD2 with time due to the charge loss in the flag cell. In this case, the first bits BIT1 of the programmed data in the two-bit MLCs have to be determined using the second read voltage VRD2. Third data are generated by re-reading the first bits BIT1 of the programmed data in the two-bit MLCs based on the second read voltage VRD2 (step S510), the third data are stored in the first storage unit (step S520), and the third data that are generated by the step S510 and stored in the first storage unit may be output as the read data (step S530). The third data may be substantially the same as the first data. Since the third data are stored in the first storage unit, the second data may be deleted from the first storage unit.

Figure 6:
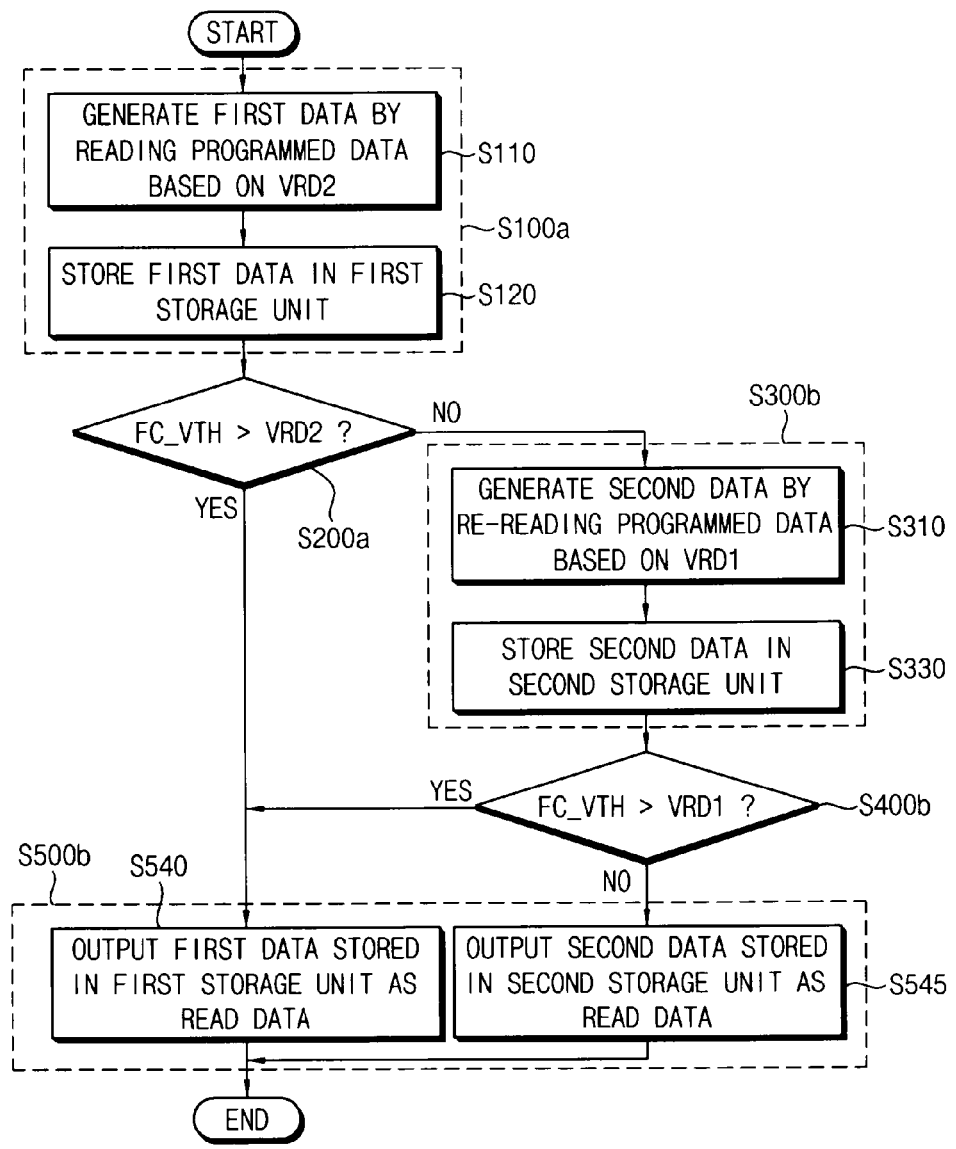
FIG. 6 is a flowchart illustrating another example of the method of reading data of FIG. 1, according to exemplary embodiments.

FIG. 6 is a flowchart illustrating another example of the method of reading data of FIG. 1, according to exemplary embodiments. Hereinafter, another example of the method of reading the first bits (e.g., the LSBs) of the multi-bit data in the two-bit MLCs will be explained in detail with reference to FIGS. 4A, 4B, 4C and 6.

The first read operation (step S100a) and the first sensing operation (step S200a) may be substantially the same as the steps S100a and S200a in FIG. 5, respectively. That is, the first data are generated by reading the first bits BIT1 of the programmed data in the two-bit MLCs based on the second read voltage VRD2 (step S110), the first data are stored in the first storage unit (step S120), and the threshold voltage FC_VTH of the flag cell is compared with the second read voltage VRD2 (step S200a).

When the level of the threshold voltage FC_VTH of the flag cell is lower than the level of the second read voltage VRD2, the second read operation is further performed. In the second read operation on the MLCs (step S300b), the second data is generated by re-reading the first bits BIT1 of the programmed data in the two-bit MLCs based on the first read voltage VRD1 (step S310), and the second data is stored in a second storage unit (step S330). The second storage unit may be included in the page buffer 310 in FIG. 2, and may be different from the first storage unit. In other words, the first data and the second data may be stored in different storage units, and the first data may not be deleted from the first storage unit even though the second read operation is performed.

When the second read operation is performed, the second sensing operation is performed. In the second sensing operation on the at least one flag cell, the threshold voltage FC_VTH of the flag cell is compared with the first read voltage VRD1 (step S400b). The second read operation and the second sensing operation may be performed substantially at the same time.

The read data are output based on the result of the first read operation, the result of the first sensing operation, the result of the second read operation and the result of the second sensing operation (step S500b).

For example, when the level of the threshold voltage FC_VTH of the flag cell is higher than the level of the second read voltage VRD2 (step S200a: YES), it is determined that two bits of data are programmed in each two-bit MLC. When the level of the threshold voltage FC_VTH of the flag cell is lower than the level of the second read voltage VRD2 and is higher than the level of the first read voltage VRD1 (step S200a: NO and step S400b: YES), it is determined that two bits of data are programmed in each two-bit MLC and electric charges stored in the flag cell are lost. In each of these cases, since the first bits BIT1 of the programmed data in the two-bit MLCs have to be determined using the second read voltage VRD2, the first data that are generated by the first read operation and stored in the first storage unit are output as the read data (step S540).

Further, for example, when the level of the threshold voltage FC_VTH of the flag cell is lower than the level of the first read voltage VRD1 (step S200a: NO and step S400b: NO), it is determined that one bit of data is programmed in each two-bit MLC. In this case, since the first bits BIT1 of the programmed data in the two-bit MLCs have to be determined using the first read voltage VRD1, the second data that are generated by the second read operation and stored in the second storage unit are output as the read data (step S545).

The read data may correspond to the first bits BIT1 (e.g., the LSBs) of the programmed data in the two-bit MLCs. In the methods of reading data shown in FIGS. 5 and 6, a data read error associated with the LSBs of the programmed data may be reduced, and the nonvolatile memory device may effectively read the programmed data stored in the two-bit MLCs. In the method of reading data of FIG. 6, the first data and the second data may be stored in different storage units, and thus the nonvolatile memory device may effectively read the programmed data stored in the two-bit MLCs without additional steps, such as steps S510 and S520 in FIG. 5, when the level of the threshold voltage FC_VTH of the flag cell is lower than the level of the second read voltage VRD2 and higher than the level of the first read voltage VRD1 (e.g., step S200a: NO and step S400b: YES).

Although not illustrated in FIGS. 5 and 6, after the read data are output, second read data that correspond to the second bits BIT2 (e.g., the MSBs) of the programmed data in the two-bit MLCs may be further generated when it is determined that two bits of data are programmed in each two-bit MLC (e.g., (a) step S200a: YES and after step S530 in FIG. 5; (b) step S200a: NO, step S400a: YES and after step S530 in FIG. 5; and (c) after step S40 in FIG. 6). For example, the second bits BIT2 of the programmed data in two-bit MLCs may be determined using the first and third read voltages VRD1 and VRD3.

FIGS. 7A, 7B, 7C and 7D are diagrams for describing the method of FIG. 1, according to other exemplary embodiments.

More particularly, FIGS. 7A, 7B, 7C and 7D illustrate examples of threshold voltage distributions and logic states of MLCs and read voltages used in the method of reading data according to other exemplary embodiments. In FIGS. 7A, 7B, 7C and 7D, the MLCs may be three-bit MLCs and may perform the read and sensing operations based on seven read voltages VRD1, VRD2, VRD3, VRD4, VRD5, VRD6 and VRD7. "FC_VTH1" indicates a threshold voltage of a first flag cell corresponding to the MLCs, "FC_VTH2" indicates a threshold voltage of a second flag cell corresponding to the MLCs, "BITA" indicates a first bit (e.g., a LSB or a lower bit) of multi-bit data in each MLC, "BITB" indicates a second bit (e.g., a middle bit) of the multi-bit data in each MLC, and "BITC" indicates a third bit (e.g., a MSB or an upper bit) of the multi-bit data in each MLC.

Figure 7A:
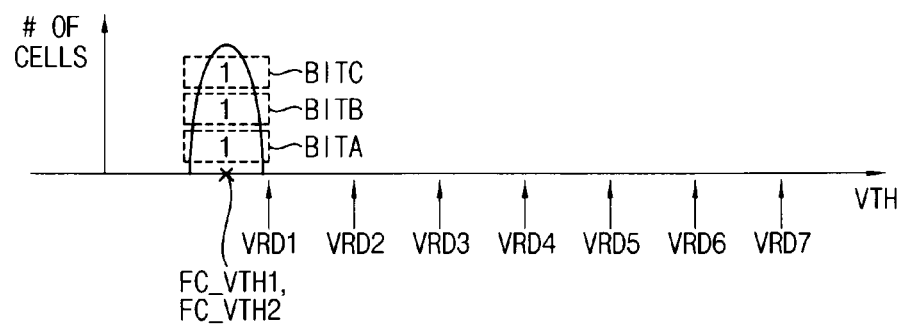
FIGS. 7A, 7B, 7C and 7D are diagrams for describing the method of FIG. 1, according to exemplary embodiments.

Referring to FIG. 7A, when data are not programmed in each MLC (e.g., three-bit MLC), the MLCs have a fourth pattern of threshold voltage distributions such that levels of threshold voltages of all MLCs are lower than a level of a first read voltage VRD1. As illustrated in FIG. 7A, the logic states of the MLCs may be in one logic state, such as "111." A level of the threshold voltage FC_VTH1 of the first flag cell and a level of the threshold voltage FC_VTH2 of the second flag cell are lower than the level of the first read voltage VRD1, respectively.

Figure 7B:
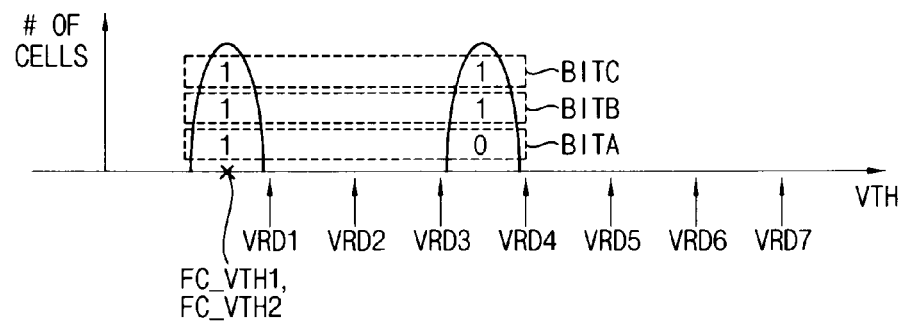

Referring to FIG. 7B, when one bit of data is programmed in each MLC, the MLCs have a fifth pattern of threshold voltage distributions such that threshold voltage distributions of the MLCs are separated with respect to one of the first, second and third read voltages VRD1, VRD2 and VRD3. As illustrated in FIG. 7B, the logic states of the MLCs may be in two different logic states, such as "111" and "110," in the increasing order of the threshold voltage. In this case, the level of the threshold voltage FC_VTH1 of the first flag cell and the level of the threshold voltage FC_VTH2 of the second flag cell are still lower than the level of the first read voltage VRD1, respectively.

Figure 7C:
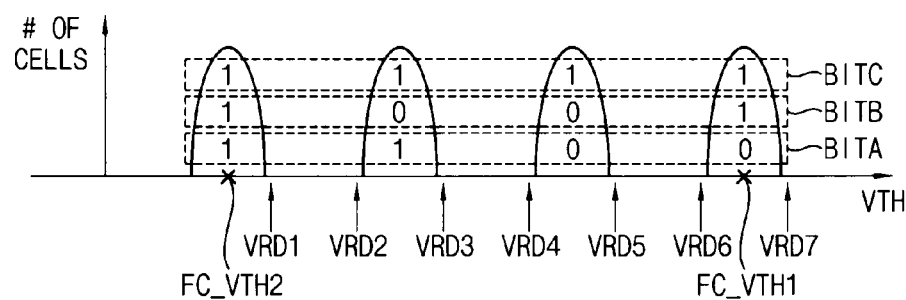

Referring to FIG. 7C, when two bits of data is programmed in each MLC, the MLCs have a sixth pattern of threshold voltage distributions such that threshold voltage distributions of the MLCs are separated with respect to one of the first and second read voltages VRD1 and VRD2, one of the third and fourth read voltages VRD3 and VRD4, and one of fifth and sixth read voltages VRD5 and VRD6. As illustrated in FIG. 7C, the logic states of the MLCs may be in four different logic states, such as "111", "101", "100" and "110," in the increasing order of the threshold voltage. In this case, the level of the threshold voltage FC_VTH1 of the first flag cell is higher than a level of the sixth read voltage VRD6 and lower than a level of a seventh read voltage VRD7, and the level of the threshold voltage FC_VTH2 of the second flag cell is still lower than the level of the first read voltage VRD1. In other words, the first flag cell has information about whether two bits of data are programmed in each MLC.

Figure 7D:
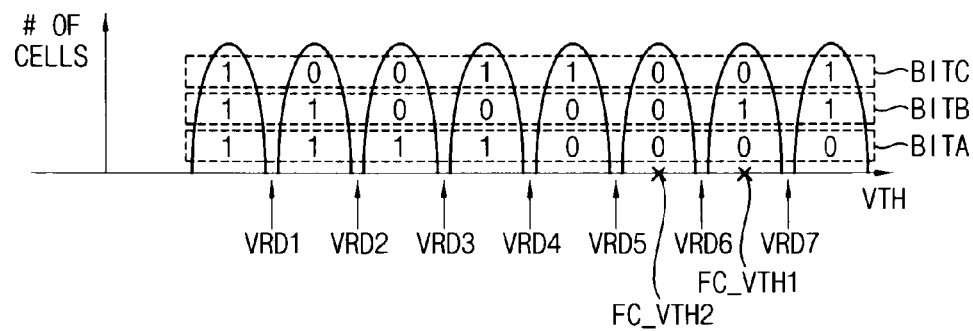

Referring to FIG. 7D, when three bits of data are programmed in each MLC, the MLCs have a seventh pattern of threshold voltage distributions such that threshold voltage distributions of the MLCs are separated with respect to the first through seventh read voltages VRD1, VRD2, VRD3, VRD4, VRD5, VRD6 and VRD7. As illustrated in FIG. 7D, the logic states of the MLCs may be in eight different logic states, such as "111", "011", "001", "101", "100", "000", "010" and "110," in the increasing order of the threshold voltage. In this case, the level of the threshold voltage FC_VTH1 of the first flag cell is still higher than the level of the sixth read voltage VRD6 and still lower than the level of the seventh read voltage VRD7, and the level of the threshold voltage FC_VTH2 of the second flag cell is be higher than a level of the fifth read voltage VRD5 and lower than the level of the sixth read voltage VRD6. In other words, the second flag cell has information about whether three bits of data is programmed in each MLC.

Figure 8:
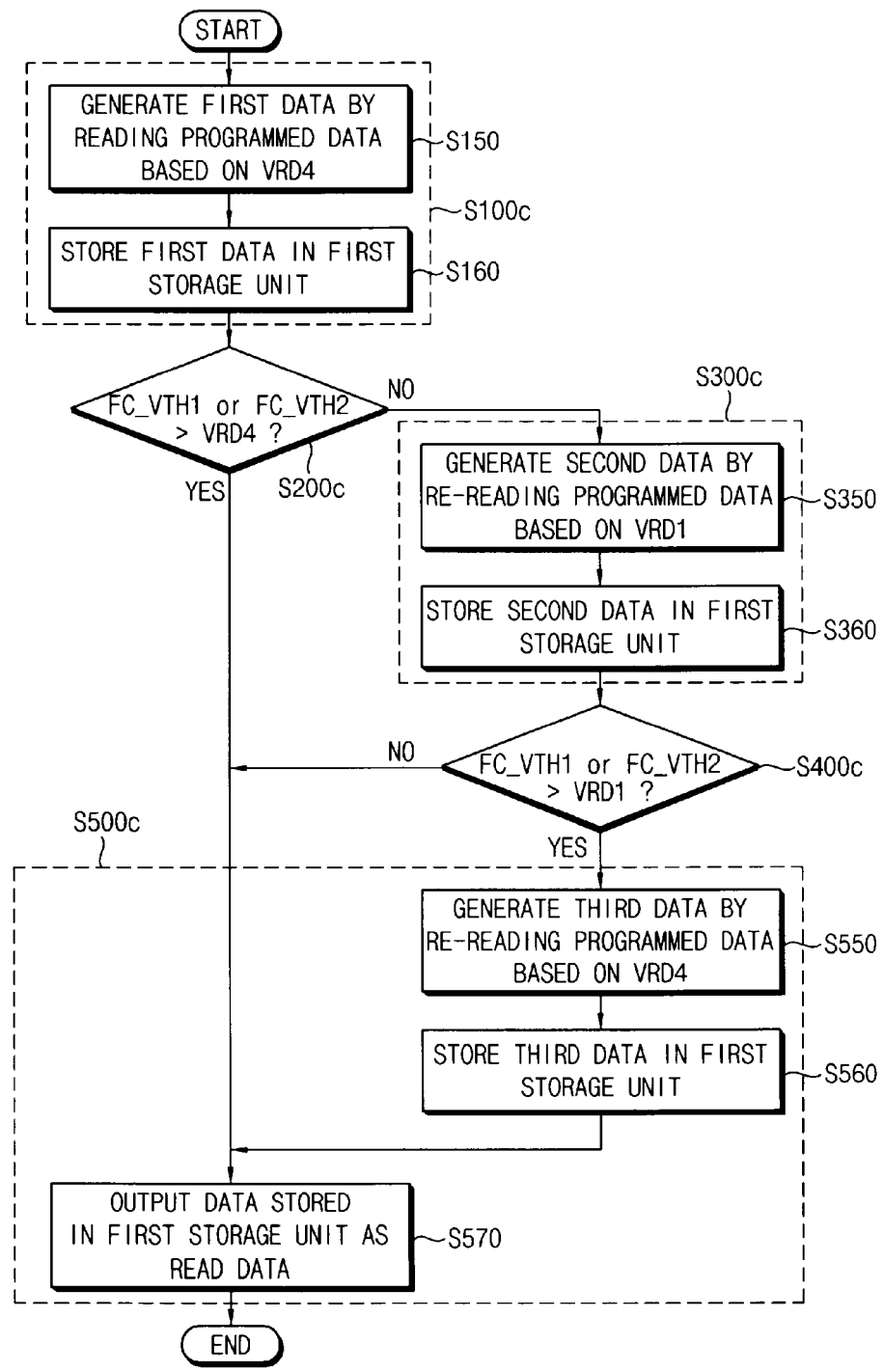
FIG. 8 is a flowchart illustrating still another example of the method of reading data of FIG. 1, according to exemplary embodiments.

FIG. 8 is a flowchart illustrating another example of the method of reading data of FIG. 1, according to exemplary embodiments. Hereinafter, an example of the method of reading first bits (e.g., LSBs) of multi-bit data in the three-bit MLCs will be explained in detail with reference to FIGS. 7A, 7B, 7C, 7D and 8.

In the first read operation on the MLCs (step S100c), first data is generated by reading the first bits BITA of the programmed data in the plurality of three-bit MLCs based on the fourth read voltage VRD4 (step S150), and the first data are stored in a first storage unit (step S160). For example, a first determination is performed based on the second read voltage VRD2. When levels of threshold voltages of some three-bit MLCs are higher than the level of the fourth read voltage VRD4, the first bits BITA of data in some three-bit MLCs may be determined as "0". When levels of threshold voltages of other three-bit MLCs are lower than the level of the fourth read voltage VRD4, the first bits BITA of data in other three-bit MLCs may be determined as "1". The first data may be generated based on the first determination. The first storage unit may be included in the page buffer 310 in FIG. 2.

In the first sensing operation on the at least one flag cell, the threshold voltage FC_VTH1 of the first flag cell and the threshold voltage FC_VTH2 of the second flag cell are compared with the fourth read voltage VRD4, respectively (step S200c). The three-bit MLCs, the first flag cell and the second flag cell may be included in the same page of the NAND flash memory device. The first read operation and the first sensing operation may be performed substantially at the same time.

When both the level of the threshold voltage FC_VTH1 of the first flag cell and the level of the threshold voltage FC_VTH2 of the second flag cell are lower than the level of the fourth read voltage VRD4, it is determined that one bit of data is programmed in each three-bit MLC, as illustrated in FIG. 7B. In this case, since the first bits BITA of the programmed data in the three-bit MLCs have to be determined using the first read voltage VRD1, the second read operation is further performed. In the second read operation on the MLCs (step S300c), second data are generated by re-reading the first bits BITA of the programmed data in the three-bit MLCs based on the first read voltage VRD1 (step S350), and the second data are stored in the first storage unit (step S360). For example, a second determination may be performed based on the first read voltage VRD1. When levels of threshold voltages of some three-bit MLCs are higher than the level of the first read voltage VRD1, the first bits BIT1 of data in some three-bit MLCs may be determined as "0". When levels of threshold voltages of other three-bit MLCs are lower than the level of the first read voltage VRD1, the first bits BIT1 of data in other three-bit MLCs may be determined as "1". The second data are generated based on the second determination. Since the second data are stored in the first storage unit, the first data may be deleted from the first storage unit.

When the second read operation is performed, the second sensing operation is performed. In the second sensing operation on the at least one flag cell, the threshold voltage FC_VTH1 of the first flag cell and the threshold voltage FC_VTH2 of the second flag cell are compared with the first read voltage VRD1, respectively (step S400c). The second read operation and the second sensing operation may be performed substantially at the same time.

The read data that corresponds to the programmed data in the MLCs may be output based on the result of the first read operation, the result of the first sensing operation, the result of the second read operation and the result of the second sensing operation (step S500c). For example, when the level of the threshold voltage FC_VTH1 of the first flag cell or the level of the threshold voltage FC_VTH2 of the second flag cell is higher than the level of the fourth read voltage VRD4 (step S200c: YES), it is determined that at least two bits of data are programmed in each three-bit MLC, as illustrated in FIGS. 7C and 7D. In this case, since the first bits BITA of the programmed data in the three-bit MLCs have to be determined using the fourth read voltage VRD4, the second read operation (step S300c) and the second sensing operation (step S400c) may be skipped, and the first data that are generated by the first read operation and stored in the first storage unit may be output as the read data (step S570).

Further, for example, when both the level of the threshold voltage FC_VTH1 of the first flag cell and the level of the threshold voltage FC_VTH2 of the second flag cell are lower than the level of the first read voltage VRD1 (step S200c: NO and step S400c: NO), it is determined that one bit of data is programmed in each three-bit MLC, as illustrated in FIG. 7B. In this case, since the first bits BITA of the programmed data in the three-bit MLCs have to be determined using the first read voltage VRD1, the second read operation (step S300c) and the second sensing operation (step S400c) may be performed, and the second data that are generated by the second read operation and stored in the first storage unit may be output as the read data (step S570).

Further, when the level of the threshold voltage FC_VTH1 of the first flag cell and the level of the threshold voltage FC_VTH2 of the second flag cell are lower than the level of the fourth read voltage VRD4, and when the level of the threshold voltage FC_VTH1 of the first flag cell or the level of the threshold voltage FC_VTH2 of the second flag cell is higher than the level of the first read voltage VRD1 (step S200c: NO and step S400c: YES), it is determined that at least two bits of data is programmed in each three-bit MLC and electric charges stored in the first flag cell or in the second flag cell are lost. In this case, the first bits BITA of the programmed data in the three-bit MLCs have to be determined using the fourth read voltage VRD4. Third data may be generated by re-reading the first bits BITA of the programmed data in the three-bit MLCs based on the fourth read voltage VRD4 (step S550). The third data are stored in the first storage unit (step S560), and the third data that are generated by the step S550 and stored in the first storage unit may be output as the read data (step S570). The third data may be substantially the same as the first data. Since the third data are stored in the first storage unit, the second data may be deleted from the first storage unit.

Figure 9:
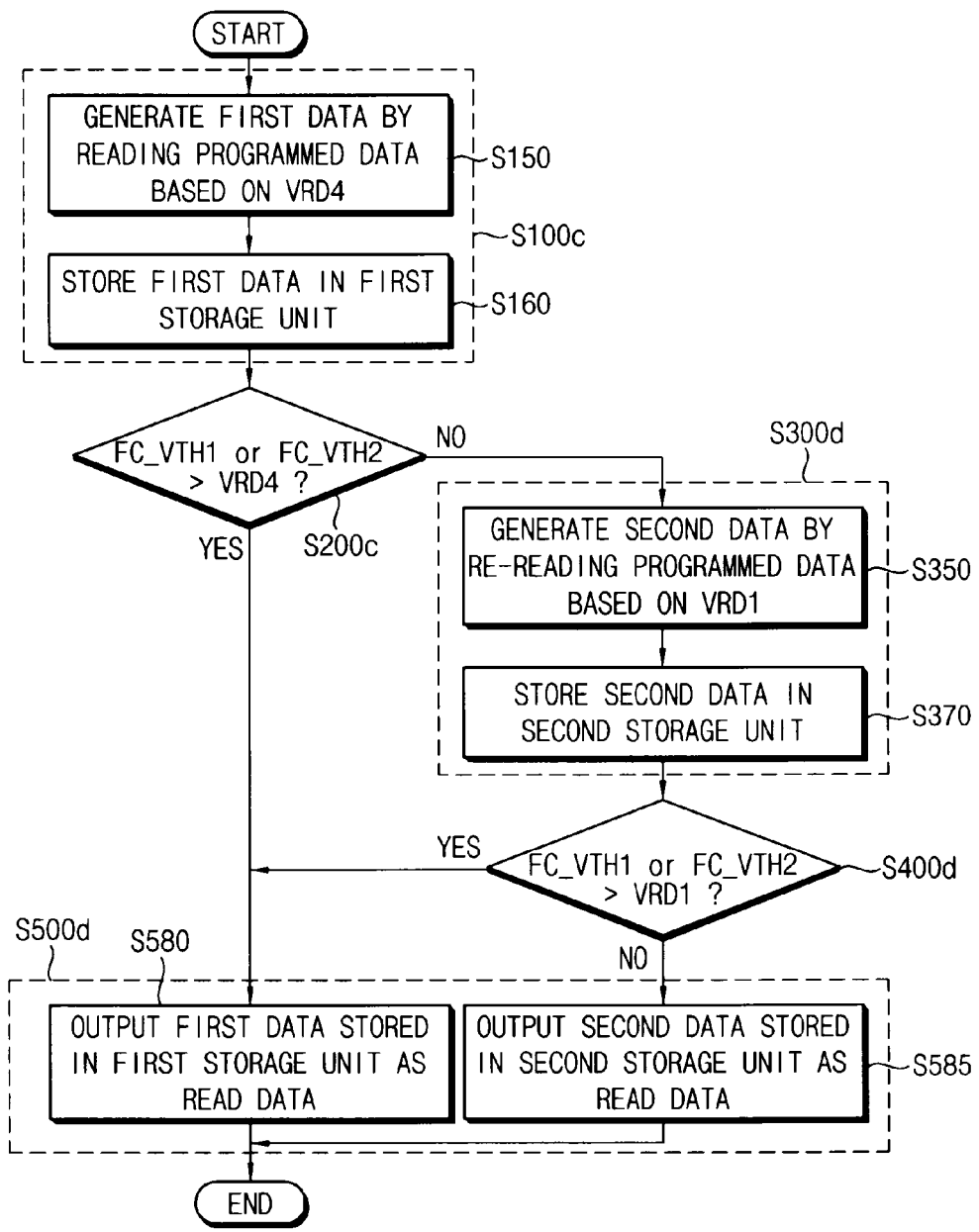
FIG. 9 is a flowchart illustrating still another example of the method of reading data of FIG. 1, according to exemplary embodiments.

FIG. 9 is a flowchart illustrating still another example of the method of reading data of FIG. 1, according to an exemplary embodiment. Hereinafter, another example of the method of reading the first bits (e.g., the LSBs) of the multi-bit data in the three-bit MLCs will be explained in detail with reference to FIGS. 7A, 7B, 7C, 7D and 9.

The first read operation (step S100c) and the first sensing operation (step S200c) may be substantially the same as the steps S100c and S200c in FIG. 8, respectively. The first data is generated by reading the first bits BITA of the programmed data in the three-bit MLCs based on the fourth read voltage VRD4 (step S150), the first data is stored in the first storage unit (step S160), and the threshold voltage FC_VTH1 of the first flag cell and the threshold voltage FC_VTH2 of the second flag cell are compared with the fourth read voltage VRD4, respectively (step S200c).

When both the level of the threshold voltage FC_VTH1 of the first flag cell and the level of the threshold voltage FC_VTH2 of the second flag cell are lower than the level of the fourth read voltage VRD4, the second read operation is further performed. In the second read operation on the MLCs (step S300d), the second data are generated by re-reading the first bits BITA of the programmed data in the three-bit MLCs based on the first read voltage VRD1 (step S350), and the second data are stored in a second storage unit (step S370). The second storage unit may be included in the page buffer 310 in FIG. 2, and may be different from the first storage unit.

When the second read operation is performed, the second sensing operation is performed. In the second sensing operation on the at least one flag cell, the threshold voltage FC_VTH1 of the first flag cell and the threshold voltage FC_VTH2 of the second flag cell are compared with the first read voltage VRD1, respectively (step S400d). The second read operation and the second sensing operation may be performed substantially at the same time.

The read data may be output based on the result of the first read operation, the result of the first sensing operation, the result of the second read operation and the result of the second sensing operation (step S500d). For example, when the level of the threshold voltage FC_VTH1 of the first flag cell or the level of the threshold voltage FC_VTH2 of the second flag cell is higher than the level of the fourth read voltage VRD4 (step S200c: YES), it is determined that at least two bits of data are programmed in each three-bit MLC. Further, for example, when the level of the threshold voltage FC_VTH1 of the first flag cell and the level of the threshold voltage FC_VTH2 of the second flag cell are lower than the level of the fourth read voltage VRD4, and when the level of the threshold voltage FC_VTH1 of the first flag cell or the level of the threshold voltage FC_VTH2 of the second flag cell is higher than the level of the first read voltage VRD1 (step S200c: NO and step S400d: YES), it is determined that at least two bits of data is programmed in each three-bit MLC and electric charges stored in the first flag cell or in the second flag cell are lost. In these cases, since the first bits BITA of the programmed data in the three-bit MLCs have to be determined using the fourth read voltage VRD4, the first data that are generated by the first read operation and are stored in the first storage unit may be output as the read data (step S580).

Further, when both the level of the threshold voltage FC_VTH1 of the first flag cell and the level of the threshold voltage FC_VTH2 of the second flag cell are lower than the level of the first read voltage VRD1 (step S200c: NO and step S400d: NO), it is determined that one bit of data is programmed in each three-bit MLC. In this case, since the first bits BITA of the programmed data in the three-bit MLCs have to be determined using the first read voltage VRD1, the second data that are generated by the second read operation and are stored in the second storage unit may be output as the read data (step S585).

The read data may correspond to the first bits BITA (e.g., the LSBs) of the programmed data in the three-bit MLCs. In the methods of reading data of FIGS. 8 and 9, a data read error associated with the LSBs of the programmed data may be reduced, and the nonvolatile memory device may effectively read the programmed data stored in the three-bit MLCs. In the method of reading data of FIG. 9, the first data and the second data may be stored in different storage units, and thus the nonvolatile memory device may effectively read the programmed data stored in the three-bit MLCs without additional steps, such as steps S550 and S560 in FIG. 8, when the level of the threshold voltage FC_VTH1 of the first flag cell and the level of the threshold voltage FC_VTH2 of the second flag cell are lower than the level of the fourth read voltage VRD4, and when the level of the threshold voltage FC_VTH1 of the first flag cell or the level of the threshold voltage FC_VTH2 of the second flag cell is higher than the level of the first read voltage VRD1 (step S200c: NO and step S400d: YES).

Although not illustrated in FIGS. 8 and 9, after the read data are output, second read data that correspond to the other bits (e.g., the second bits BITB and/or the third bits BITC) of the programmed data in the three-bit MLCs may be further generated when it is determined that at least two bits of data are programmed in each three-bit MLC (e.g., (a) step S200c: YES and after step S570 in FIG. 8; (b) step S200c: NO, step S400c: YES and after step S570 in FIG. 8; and (c) after step S80 in FIG. 9). For example, the second bits BITB of the programmed data in the three-bit MLCs may be determined using the second and sixth read voltages VRD2 and VRD6, and the third bits BITC of the programmed data in the three-bit MLCs may be determined using the first, third, fifth and seventh read voltages VRD1, VRD3, VRD5 and VRD7.

Figure 10:
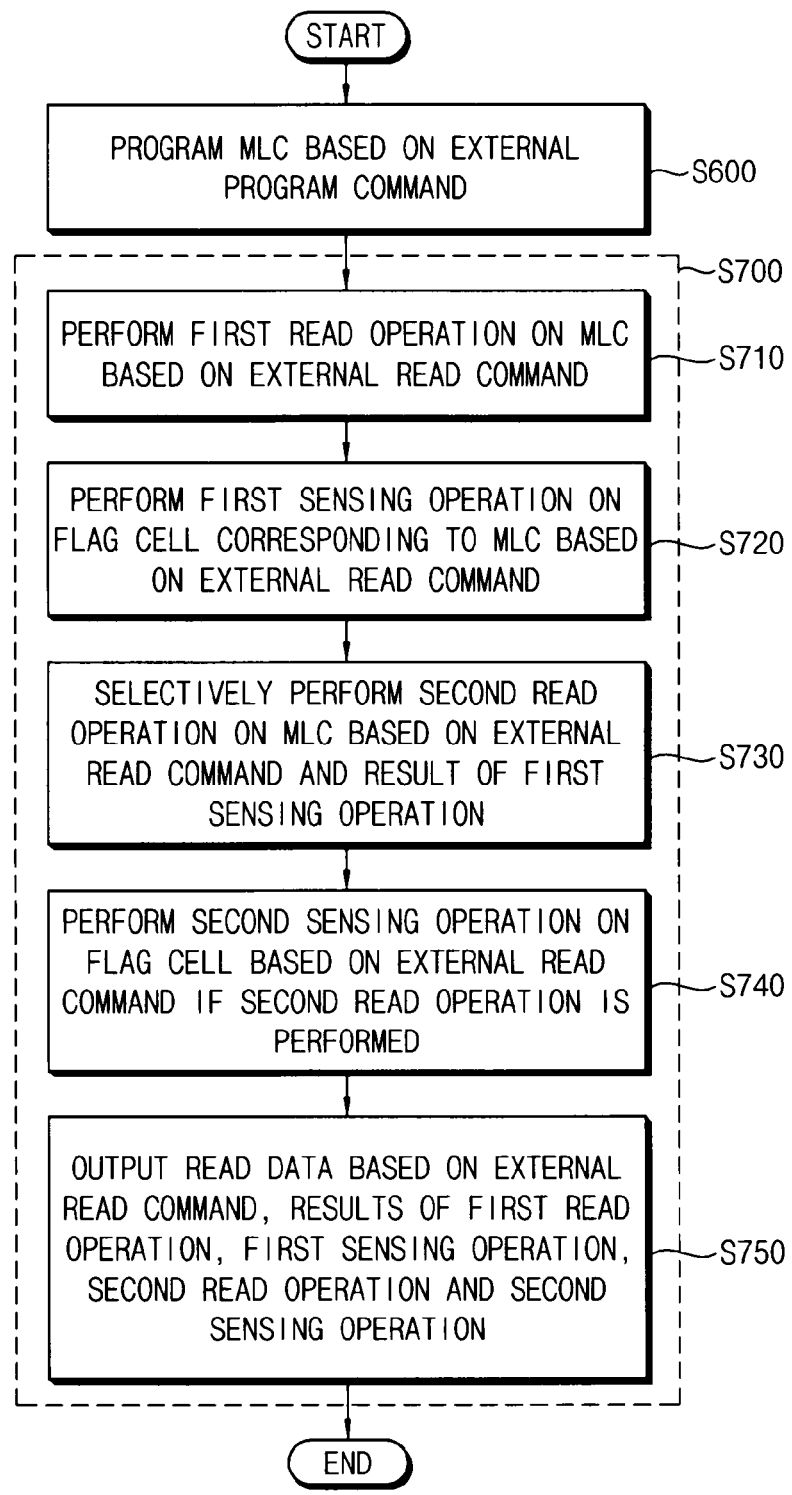
FIG. 10 is a flowchart illustrating a method of operating a nonvolatile memory device, according to exemplary embodiments.

FIG. 10 is a flowchart illustrating a method of operating a nonvolatile memory device according to exemplary embodiments.

Referring to FIG. 10, in the method of operating the nonvolatile memory device according to exemplary embodiments, multiple MLCs are programmed based on a program command received from an external control circuit (step S600). For example, multi-bit data may be programmed in the MLCs using various program schemes.

The programmed data in the MLCs may be read based on a read command received from the external control circuit (step S700). For example, read data that correspond to LSBs of the multi-bit data in the MLCs may be output.

The step S700 may be substantially the same as the method of reading data illustrated in FIG. 1, and may be performed similar to one of the embodiments illustrated in FIGS. 5, 6, 8 and 9, for example. In the operation of reading the programmed data in the MLCs (step S700), a first read operation is performed on the MLCs based on the read command (step S710), a first sensing operation is performed on the at least one flag cell corresponding to the MLCs based on the read command (step S720), the second read operation is selectively performed on the MLCs based on the result of the first sensing operation and the read command (step S730), a second sensing operation is performed on the at least one flag cell based on the read command if the second read operation is performed (step S740), and the read data are output based on the result of the first read operation, the result of the first sensing operation, the result of the second read operation, the result of the second sensing operation and based on the read command (step S750).

Although not illustrated in FIG. 10, after step S750, second read data that correspond to MSBs or the other bits of the programmed data in the MLCs may be further output.

Figure 11:
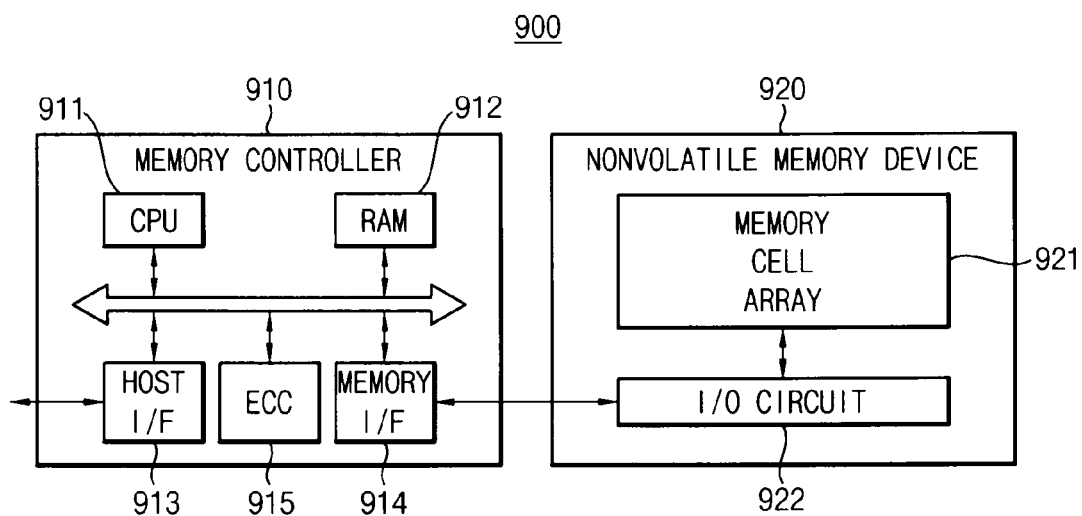
FIG. 11 is a block diagram illustrating a memory system, according to exemplary embodiments.

FIG. 11 is a block diagram illustrating a memory system, according to exemplary embodiments.

Referring to FIG. 11, a memory system 900 includes a memory controller 910 and a nonvolatile memory device 920. The nonvolatile memory device 920 includes a memory cell array 921 and an I/O circuit 922. The I/O circuit 922 may include page buffers that are coupled to bitlines, and may store data to be written in the memory cell array 921 or data read out from the memory cell array 921. The memory cell array 921 may include MLCs coupled to wordlines and the bitlines. The nonvolatile memory device 920 may read programmed data in the MLCs by performing at least two sensing operations on at least one flag cell that stores information about the number of bits of data programmed in each MLC. For example, a first sensing operation may be performed to determine the number of bits of the data programmed in each MLC, and a second sensing operation may be selectively performed to determine whether the electric charges stored in the at least one flag cell are lost, as described above. Accordingly, the data read error may be reduced, and the nonvolatile memory device 920 may effectively read the programmed data stored in the MLCs.

The memory controller 910 controls the nonvolatile memory device 920. The memory controller 910 may control data transfer between an external host (not illustrated) and the nonvolatile memory device 920. The memory controller 910 includes a central processing unit (CPU) 911, a buffer memory 912, a host interface 913 and a memory interface 914. The central processing unit 911 may perform operations for the data transfer. The buffer memory 912 may be implemented by random access memory (RAM), dynamic RAM (DRAM), static RAM (SRAM), phase-change RAM (PRAM), ferroelectric RAM (FRAM), resistive RAM (RRAM), magnetic (MRAM), etc. According to exemplary embodiments, the buffer memory 912 may be located inside or outside the memory controller 910.

The host interface 913 is coupled to the host, and the memory interface 914 is coupled to the nonvolatile memory device 920. The central processing unit 911 may communicate with the host via the host interface 913. For example, the host interface 913 may be configured to communicate with the host using at least one of various interface protocols, such as a universal serial bus (USB), a multimedia card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI), integrated drive electronics (IDE), etc. Further, the central processing unit 911 may communicate with the nonvolatile memory device 920 via the memory interface 914. In exemplary embodiments, the memory controller 910 may further include an error correction block 915 for error correction. According to exemplary embodiments, the memory controller 910 may be included in the nonvolatile memory device 920, or the memory controller 910 and the nonvolatile memory device 920 may be implemented as separate chips.

The memory system 900 may be implemented as a memory card, a solid state drive, etc. In exemplary embodiments, the nonvolatile memory device 920, the memory controller 910 and/or the memory system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 12:
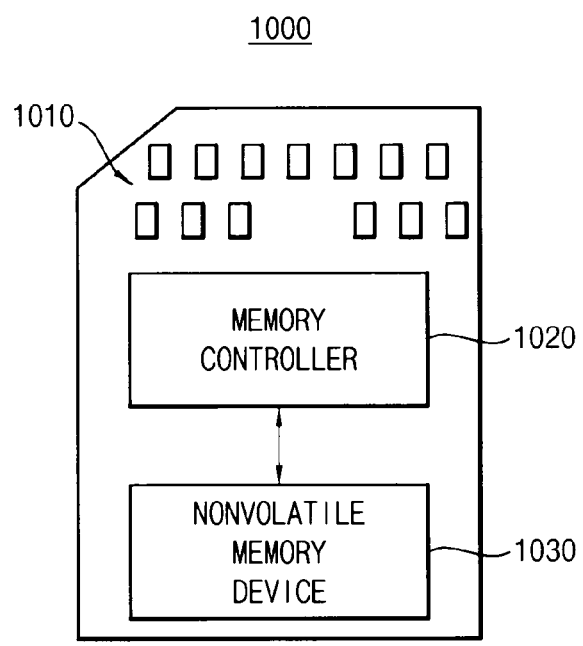
FIG. 12 is a block diagram illustrating a memory card including a memory system, according to exemplary embodiments.

FIG. 12 is a diagram illustrating a memory card including a memory system, according to exemplary embodiments.

Referring to FIG. 12, a memory card 1000 includes connecting pins 1010, a memory controller 1020 and a nonvolatile memory device 1030.

The connecting pins 1010 may be coupled to a host (not illustrated) to transfer signals between the host and the memory card 1000. The connecting pins 1010 may include a clock pin, a command pin, a data pin and/or a reset pin.

The memory controller 1020 may receive data from the host, and may store the received data in the nonvolatile memory device 1030. The nonvolatile memory device 1030 may include MLCs. The nonvolatile memory device 1030 may read programmed data in the MLCs by performing at least two sensing operations on the at least one flag cell that stores information about the number of bits of data programmed in each MLC, as described above. Accordingly, the data read error may be reduced, and the nonvolatile memory device 1030 may effectively read the programmed data stored in the MLCs.

For example, the memory card 1000 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some exemplary embodiments, the memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 13:
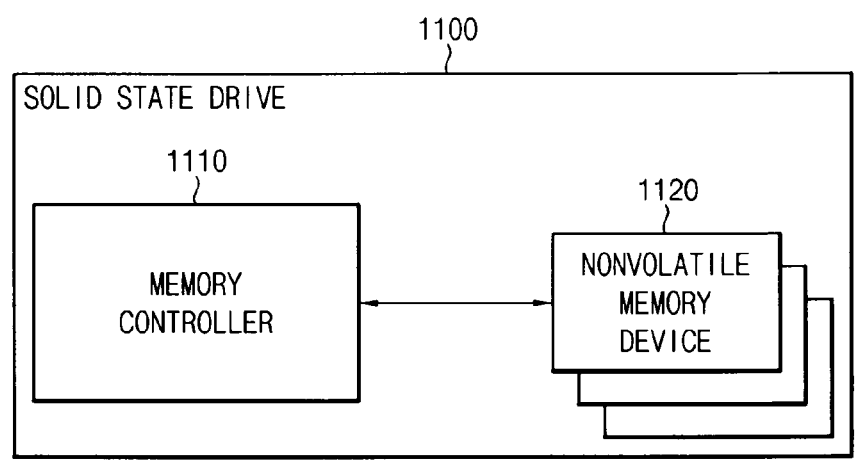
FIG. 13 is a block diagram illustrating a solid state drive including a memory system, according to exemplary embodiments.

FIG. 13 is a block diagram illustrating a solid state drive including a memory system, according to exemplary embodiments.

Referring to FIG. 13, a solid state drive (SSD) 1100 includes a memory controller 1110 and multiple nonvolatile memory devices 1120.

The memory controller 1110 may receive data from a host (not illustrated). The memory controller 1110 may store the received data in the nonvolatile memory devices 1120. The nonvolatile memory devices 1120 may include MLCs. The nonvolatile memory devices 1120 may read programmed data in the MLCs by performing at least two sensing operations on the at least one flag cell that stores information about the number of bits of data programmed in each MLC, as described above. Accordingly, the data read error may be reduced, and the nonvolatile memory devices 1120 may effectively read the programmed data stored in the MLCs.

In some exemplary embodiments, the solid state drive 1100 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 14:
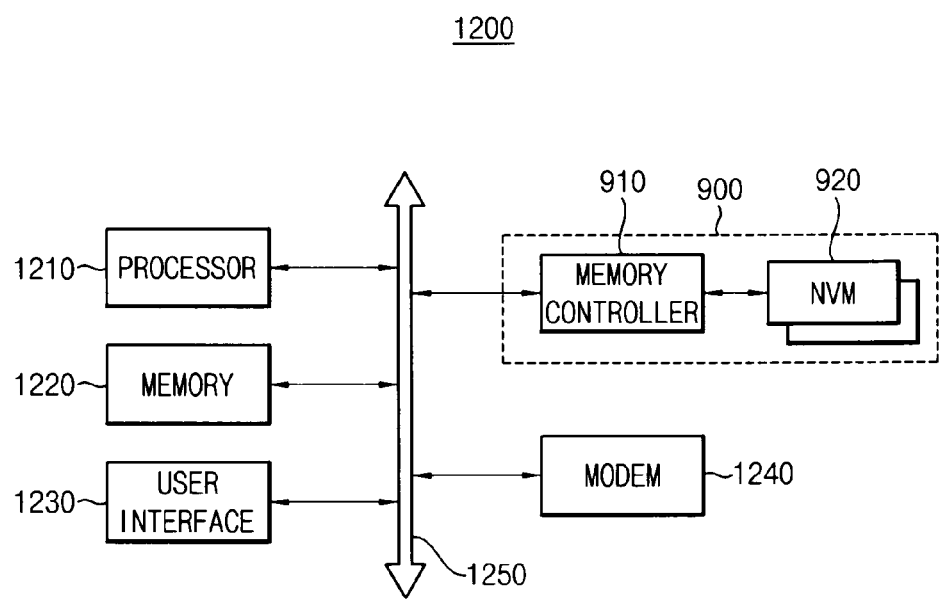
FIG. 14 is a block diagram illustrating a computing system, according to exemplary embodiments.

FIG. 14 is a block diagram illustrating a computing system, according to exemplary embodiments.

Referring to FIG. 14, a computing system 1200 includes a processor 1210, a memory device 1220, a user interface 1230 and a memory system 900. In some exemplary embodiments, the computing system 1200 may further include a modem 1240, such as a baseband chipset.

The processor 1210 may perform specific calculations or tasks. For example, the processor 1210 may be a microprocessor, a central processing unit (CPU), a digital signal processor, or the like. The processor 1210 may be coupled to the memory device 1220 via a bus 1250, such as an address bus, a control bus and/or a data bus. For example, the memory device 1220 may be implemented by DRAM, mobile DRAM, SRAM, PRAM, FRAM, RRAM, MRAM and/or flash memory. Further, the processor 1210 may be coupled to an extension bus, such as a peripheral component interconnect (PCI) bus, and may control the user interface 1230 including at least one input device, such as a keyboard, a mouse, a touch screen, etc., and at least one output device, such as a printer, a display device, etc. The modem 1240 may perform wired or wireless communication with an external device.

The memory system 900 may be the memory system 900 of FIG. 11, for example. The nonvolatile memory device 920 may be controlled by the memory controller 910 to store data processed by the processor 1210 or data received via the modem 1240. In some exemplary embodiments, the computing system 1200 may further include a power supply, an application chipset, a camera image processor (CIS), etc.

The above described embodiments may be applied to any nonvolatile memory device including MLCs, and any devices or systems including the nonvolatile memory device. For example, the above described embodiments may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, etc.

While the inventive concept has been described with reference to exemplary embodiments, it will be apparent to those skilled in the art that various changes and modifications may be made without departing from the spirit and scope of the present invention. Accordingly, all such modifications are intended to be included within the scope of the present inventive concept as defined in the claims. Therefore, it should be understood that the above embodiments are not limiting, but illustrative, and that modifications to the disclosed exemplary embodiments, as well as other exemplary embodiments, are intended to be included within the scope of the appended claims.

What is claimed is:

1. A method of reading data in a nonvolatile memory device, the method comprising:

performing a first read operation on a plurality of multi-level memory cells (MLCs);
performing a first sensing operation on at least one flag cell corresponding to the plurality of MLCs;
selectively performing a second read operation on the plurality of MLCs based on a result of the first sensing operation;
performing a second sensing operation on the at least one flag cell when the second read operation is performed; and
outputting read data based on a result of the first read operation and the result of the first sensing operation when the second read operation is not performed, and outputting the read data based on the result of the first read operation, the result of the first sensing operation, a result of the second read operation and a result of the second sensing operation when the second read operation is performed, the read data corresponding to programmed data in the plurality of MLCs.

2. The method of claim 1, wherein the first sensing operation determines a number of bits of data programmed in each MLC, and wherein the second sensing operation determines whether electric charges stored in the at least one flag cell are lost.

3. The method of claim 2, wherein the second read operation and the second sensing operation are performed when it is determined based on the result of the first sensing operation that one bit of data is programmed in each MLC, and wherein the second read operation and the second sensing operation are skipped when it is determined based on the result of the first sensing operation that at least two bits of data are programmed in each MLC.

4. The method of claim 1, wherein performing the first read operation comprises:
generating first data by reading first bits of the programmed data in the plurality of MLCs based on a first read voltage; and
storing the first data in a first storage unit.

5. The method of claim 4, wherein performing the first sensing operation comprises:
comparing a threshold voltage of the at least one flag cell with the first read voltage.

6. The method of claim 5, wherein selectively performing the second read operation comprises:
generating second data by re-reading the first bits of the programmed data in the plurality of MLCs based on a second read voltage when a level of the threshold voltage of the at least one flag cell is lower than a level of the first read voltage; and
storing the second data in the first storage unit.

7. The method of claim 6, wherein performing the second sensing operation comprises:
comparing the threshold voltage of the at least one flag cell with the second read voltage.

8. The method of claim 7, further comprising:
selectively performing a third read operation on the plurality of MLCs based on a result of the second sensing operation, wherein selectively performing the third read operation comprises:
generating third data by re-reading the first bits of the programmed data in the plurality of MLCs based on the first read voltage when the level of the threshold voltage of the at least one flag cell is higher than a level of the second read voltage; and
storing the third data in the first storage unit.

9. The method of claim 8, wherein outputting the read data comprises:

outputting the first data stored in the first storage unit as the read data when the level of the threshold voltage of the at least one flag cell is higher than the level of the first read voltage;
outputting the second data stored in the first storage unit as the read data when the level of the threshold voltage of the at least one flag cell is lower than the level of the second read voltage; and
outputting the third data stored in the first storage unit as the read data when the level of the threshold voltage of the at least one flag cell is lower than the level of the first read voltage and higher than the level of the second read voltage.

10. The method of claim 5, wherein selectively performing the second read operation comprises:
generating second data by re-reading the first bits of the programmed data in the plurality of MLCs based on a second read voltage when a level of the threshold voltage of the at least one flag cell is lower than a level of the first read voltage; and
storing the second data in a second storage unit.

11. The method of claim 10, wherein performing the second sensing operation comprises:
comparing the threshold voltage of the at least one flag cell with the second read voltage.

12. The method of claim 10, wherein outputting the read data includes:
outputting the first data stored in the first storage unit as the read data when the level of the threshold voltage of the at least one flag cell is higher than the level of the first read voltage, or when the level of the threshold voltage of the at least one flag cell is lower than the level of the first read voltage and is higher than a level of the second read voltage; and
outputting the second data stored in the second storage unit as the read data when the level of the threshold voltage of the at least one flag cell is lower than the level of the second read voltage.

13. The method of claim 4, wherein the first bits are least significant bits (LSBs) of the programmed data in the plurality of MLCs and the read data correspond to the LSBs of the programmed data.

14. The method of claim 1, wherein the plurality of MLCs include two-bit MLCs each of which stores two bits of data, or three-bit MLCs each of which stores three bits of data.

15. The method of claim 1, wherein the plurality of MLCs include NAND flash memory cells.

16. A method of operating a nonvolatile memory device, the method comprising:
programming a plurality of multi-level memory cells (MLCs) based on a program command received from an external control circuit; and
reading programmed data in the plurality of MLCs based on a read command received from the external control circuit,
reading the programmed data in the plurality of MLCs comprising:
performing a first read operation on the plurality of MLCs;
performing a first sensing operation on at least one flag cell corresponding to the plurality of MLCs;
selectively performing a second read operation on the plurality of MLCs based on a result of the first sensing operation;
performing a second sensing operation on the at least one flag cell when the second read operation is performed; and outputting read data based on a result of the first read operation and the result of the first sensing operation when the second read operation is not performed, and outputting read data based on the result of the first read operation, the result of the first sensing operation, a result of the second read operation and a result of the second sensing operation when the second read operation is performed, the read data corresponding to programmed data in the plurality of MLCs.

17. A nonvolatile memory device, comprising:
a memory cell array comprising a plurality of multi-level memory cells (MLCs) and at least one flag cell corresponding to the plurality of MLCs, the at least one flag cell storing information about a number of bits of data programmed in each of the MLCs;
an input/output (I/O) circuit configured to read programmed data stored in the plurality of MLCs, the I/O circuit comprising at least one page buffer having at least one storage unit; and
a control circuit configured to generate first data by controlling the I/O circuit to read first bits of the programmed data stored in the plurality of MLCs based on a first read voltage, to compare a threshold voltage of the at least one flag cell with the first read voltage, to output the first data as read data when the threshold voltage of the at least one flag cell is higher than the first read voltage, to generate second data by controlling the I/O circuit to re-read the first bits of the programmed data in the plurality of MLCs based on a second read voltage when the threshold voltage of the at least one flag cell is lower than the first read voltage, and to compare the threshold voltage of the at least one flag cell with the second read voltage to determine the read data to output.

18. The method of claim 17, wherein the second read voltage is less than the first read voltage.

19. The method of claim 18, wherein the control circuit is further configured to output the first data as the read data when the threshold voltage of the at least one flag cell is less than the second read voltage data, and to generate third data by controlling the I/O circuit to re-read the first bits of the programmed data in the plurality of MLCs based on the first read voltage when the threshold voltage of the at least one flag cell is higher than the second read voltage, and to output the third data as the read data.

20. The method of claim 18, wherein the control circuit is further configured to output the first data as the read data when the threshold voltage of the at least one flag cell is higher than the second read voltage data, and to output the second data as the read data when the threshold voltage of the at least one flag cell is lower than the second read voltage data.

* * * * *